US 11,749,639 B2

(12) United States Patent
Viswanathan et al.

(10) Patent No.: US 11,749,639 B2
(45) Date of Patent: Sep. 5, 2023

(54) DIE-SUBSTRATE ASSEMBLIES HAVING SINTER-BONDED BACKSIDE VIA STRUCTURES AND ASSOCIATED FABRICATION METHODS

(71) Applicant: NXP USA, Inc., Austin, TX (US)

(72) Inventors: Lakshminarayan Viswanathan, Chandler, AZ (US); Jaynal A. Molla, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/500,318

(22) Filed: Oct. 13, 2021

(65) Prior Publication Data

US 2023/0111320 A1   Apr. 13, 2023

(51) Int. Cl.
*H01L 21/786* (2006.01)
*H01L 23/00* (2006.01)
(Continued)

(52) U.S. Cl.
CPC ........ *H01L 24/83* (2013.01); *H01L 21/76898* (2013.01); *H01L 23/481* (2013.01); *H01L 24/05* (2013.01); *H01L 24/29* (2013.01); *H01L 24/32* (2013.01); *H01L 2224/05572* (2013.01); *H01L 2224/29022* (2013.01); *H01L 2224/32245* (2013.01); *H01L 2224/83026* (2013.01); *H01L 2224/8384* (2013.01);
(Continued)

(58) Field of Classification Search
CPC ... H01L 2224/8384; H01L 2224/83026; H01L 2224/05572
See application file for complete search history.

(56) References Cited

U.S. PATENT DOCUMENTS 5,174,878 A * 12/1992 Wullenweber ............ C25B 9/77
                                                    204/279
9,362,198 B2 * 6/2016 Viswanathan ........ H01L 23/481
(Continued)

OTHER PUBLICATIONS

Barker, Anthony et al; "Advances in Back-side Via Etching of SiC for GaN Device Applications"; CS Mantech Conference, May 13-16, 2013, New Orleans, LA, USA; 4 pgs (2013).
(Continued)

*Primary Examiner* — Dale E Page
*Assistant Examiner* — Wilner Jean Baptiste

(57) ABSTRACT

Die-substrate assemblies having sinter-bonded backside via structures, and methods for fabricating such die-substrate assemblies, are disclosed. In embodiments, the method includes obtaining an integrated circuit (IC) die having a backside over which a backmetal layer is formed and into which a plated backside via extends. The IC die is attached to an electrically-conductive substrate by: (i) applying sinter precursor material over the backmetal layer and into the plated backside via; (ii) positioning a frontside of the electrically-conductive substrate adjacent the plated backmetal layer and in contact with the sinter precursor material; and (iii) sintering the sinter precursor material to yield a sintered bond layer attaching and electrically coupling the IC die to the frontside of the electrically-conductive substrate through the backmetal layer and through the plated backside via. The sintered bond layer contacts and is metallurgically bonded to the backside via lining.

20 Claims, 10 Drawing Sheets

(51) Int. Cl.
*H01L 21/768* (2006.01)
*H01L 23/48* (2006.01)

(52) U.S. Cl.
CPC ............... *H01L 2924/1033* (2013.01); *H01L 2924/10272* (2013.01); *H01L 2924/13091* (2013.01)

(56) References Cited

U.S. PATENT DOCUMENTS

| | | |
|---|---|---|
| 11,145,547 B2 * | 10/2021 | Dumka ............... H01L 29/0649 |
| 2009/0273097 A1 | 11/2009 | Hedler |
| 2015/0076711 A1 | 3/2015 | Blanchard et al. |
| 2016/0099210 A1 | 4/2016 | Kwon et al. |
| 2020/0395475 A1 | 12/2020 | Bothe et al. |
| 2021/0082820 A1 | 3/2021 | Wakisaka |

OTHER PUBLICATIONS

Ruan, Ju-Ai et al; "Backside via process of GaN Fabrication"; CS Mantech Conference, Apr. 23-26, 2012, Boston, MA, USA; 3 pgs (2012).

Shaowei, He et al; "Silicon Carbide Power Electronic Module Packaging"; 16th Int'l Conf on Electronic Packaging Technology; 4 pages (2015).

* cited by examiner

DIE-SUBSTRATE ASSEMBLIES HAVING SINTER-BONDED BACKSIDE VIA STRUCTURES AND ASSOCIATED FABRICATION METHODS

TECHNICAL FIELD

Embodiments of the present disclosure relate generally to microelectronics and, more particularly, to die-substrate assemblies having sinter-bonded backside via structures, as well as to methods for fabricating such die-substrate assemblies.

BACKGROUND

A die-substrate assembly contains at least one integrated circuit (IC) die bonded to a supportive substrate, such as a base flange. The IC die may include at one plated backside via and a backmetal layer; that is, a layer or multi-layer system predominantly composed of one or more metals, by weight, which is plated or otherwise formed over the die backside. An electrically-conductive (e.g., gold-tin) solder material is further commonly utilized to attach the IC die to the substrate, while establishing an electrical connection between the substrate and the backside via. Specifically, the backside via may be fabricated to include an inner plating layer or "backside via lining" electrically coupled to the backmetal layer and, in many cases, integrally formed with the backmetal layer as a continuous, electroplated layer deposited during wafer level processing. By attaching the IC die to the substrate utilizing an electrically-conductive die attach material, an electrical path is created from a frontside region of the IC die; through the electrically-conductive backside via lining, the backmetal layer, and the die attach material; and to the underlying substrate. By virtue of such an electrical connection, the underlying substrate may serve an electrically-conductive terminal of the microelectronic package or module, such as a power amplifier package or module, into which the die-substrate assembly is ultimately incorporated.

BRIEF DESCRIPTION OF THE DRAWINGS

At least one example of the present invention will hereinafter be described in conjunction with the following figures, wherein like numerals denote like elements, and.

Figure 1:
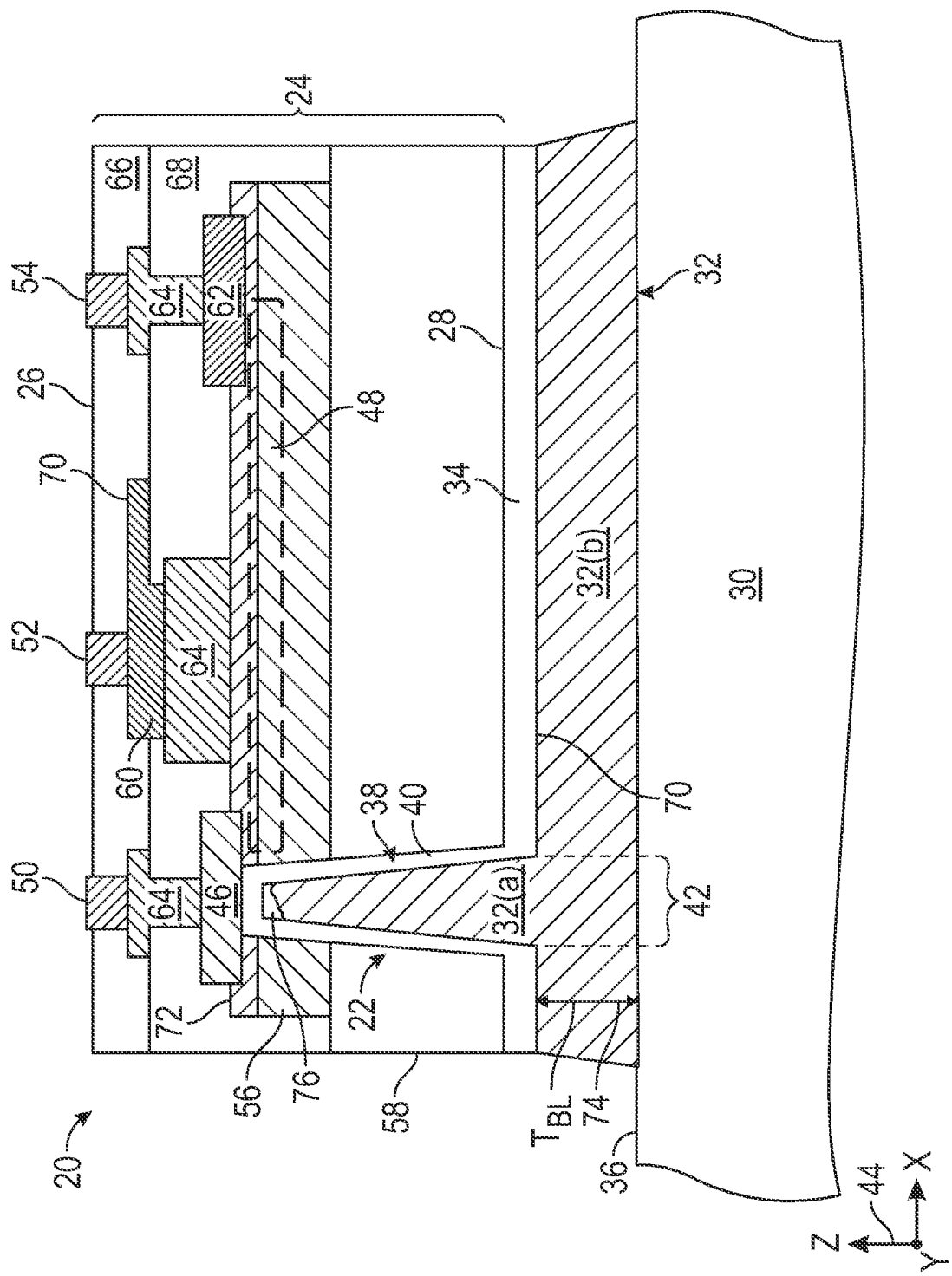
FIG. 1 is a simplified cross-sectional view of a die-substrate assembly including a sinter-bonded backside via structure and an electrically-conductive substrate, as illustrated in accordance with an example embodiment of the present disclosure.

For simplicity and clarity of illustration, descriptions and details of well-known features and techniques may be omitted to avoid unnecessarily obscuring the example and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following Detailed Description is merely example in nature and is not intended to limit the invention or the application and uses of the invention As appearing herein, the term "metallic" refers to a material principally composed of one or more metals, by weight, and potentially containing lesser amounts of metallic or non-metallic constituents. Similarly, description of a layer, structure, or other feature as composed of a named metal (or metals) indicates that the layer, structure, or other feature is principally composed of the named metal (or metals) by weight. For example, reference to a copper (Cu) layer, structure, or feature indicates that the named layer, structure, or feature is predominately composed of Cu, by weight, but may contain lesser, non-trace amounts of other constituents.

As further appearing herein, statements indicating that a first layer is "bonded to," "formed over," or "formed on" a second layer (or surface) do not require that the first layer is directly bonded to and intimately contacts the second layer (or surface) unless otherwise expressly stated. Such statements thus do not preclude the possibility that one or more intervening layers may be present between the first layer (or surface) and the second layer (or surface). Generally, in this regard, the terms "over" and "on" do not require direct contact between a first layer formed "over" or "on" a second layer (or a surface), unless otherwise accompanied by an express statement to this effect; e.g., a statement indicating that the first layer is formed "directly on" or "in contact with" the second layer (or surface). Further, the terms "over" and "on," as appearing throughout this document, are without restriction as to orientation within a larger three dimensional context. Accordingly, a first layer located beneath a second layer may be described as "formed over" the second layer when the first layer is deposited on, grown on, or otherwise created on the second layer.

Overview

Methods are disclosed for fabricating die-substrate assemblies containing unique, sinter-bonded backside via structures; that is, structures in which the inner linings (interior plating layers) of backside vias physically contact and are bonded to sintered bond layers of the type utilized to attach integrated circuit (IC) dies to electrically-conductive substrates, such as metallic base flanges. In a given die-substrate assembly, the sintered bond layer may extend into the interior of at least one plated backside via, which penetrates into and possibly through the semiconductor-containing body of an IC die. The sintered bond layer may contact the backside via lining in, at minimum, locations adjacent the outer principal opening or "mouth region" of the backside via to form high integrity, metallurgical bonds along this interface. In certain implementations, penetration or ingress of the sintered bond layer into the plated backside via may be relatively limited such that a volumetric majority of the backside via's interior remains unfilled by the sintered bond layer, with the non-filled portion of the via typically enclosing a gas-filled void. In other implementations, the sintered bond layer may penetrate more deeply or thoroughly into the plated backside via to fill at least a majority, if not the substantial entirety of the backside via's interior volume or space. In either case, the combination of the plated backside via and the sintered bond layer provides or helps provide volumetrically robust, low resistance electrical and thermal paths extending from an electrically-conductive element (e.g., a contact pad) within the IC die frontside region, through the IC die body, and to the electrically-conductive substrate to which the IC die is attached.

As discussed above, conventional die-substrate assemblies often utilize solder materials to attach an IC die to an electrically-conductive substrate, such as a base flange, while establishing an electrical connection between the base flange and at least one backside via formed in the IC die. Traditionally, a patterned solder shield layer is formed about the mouth region of each plated backside via to deter solder ingress into the via interior when a chosen solder material, commonly a gold-tin solder, is heated to a flowable state during the die attach process. Minimizing solder infiltration into the backside via (or vias) decreases the likelihood of undesirable electrochemical reactions, which may otherwise occur over time between the solder material and electrically-active structures (e.g., contact pads) within a frontside region of the IC die. While generally functional, such conventional die-substrate assembly architectures are associated with multiple limitations, several of which pertain to the inclusion of the patterned solder shield layer itself. The patterned solder shield layer is often formed by the global deposition and patterning of a metallic (e.g., titanium-based) layer through a combination of photolithography and etching using relatively aggressive chemistries. As a result, formation of the titanium-based solder shield layer often adds cost, complexity, and duration to the die-substrate assembly fabrication process. Additionally, the titanium etching process can produce undesirable changes in surface roughness and other structural characteristics of the die-substrate assembly. Concurrently, the provision of the patterned solder shield layer tends to reduce the surface area of the backside via lining and surrounding regions of the backmetal layer availed for bonding with the die attach material. This is of little consequence when an electrically-conductive solder is utilized to attach a given IC die to the underlying electrically-conductive substrate. However, when a sintered bond material is instead utilized for die attach purposes, the intervening solder shield layers can reduce or prevent metallurgical bonding between the plated backmetal layer, the backside via lining, and the sintered bond layer. This may, in turn, detract from bond strength, lower electrical conductivity, and reduce thermal conductivity across the die-substrate interface and the resulting backside via structure.

Overcoming the above-described limitations, and providing other benefits, embodiments of the presently-disclosed sinter-bonded backside via structures reduce or eliminate reliance on patterned solder shield layers within a given die-substrate assembly, while promoting high strength, low resistance metallurgical bonding between the backmetal layer, the backside via lining, and a sintered bond material utilized to attach one or more IC dies to an underlying substrate. In contrast to conventional fabrication approaches in which ingress of the electrically-conductive die attach material, such as gold-tin solder, into the plated backside vias is purposefully impeded or blocked, the presently-disclosed fabrication techniques seek to promote filling of the plated backside vias with a selected sintered bond material. In this regard, the material (or materials) processed to form the below-described sintered bond layer (herein, the "sinter precursor material") may be deposited in sufficient quantity and processed under controlled conditions to ultimately produce a sintered bond layer, which fills a volumetric majority, if not the substantial entirety of the interior volume of the backside via (or vias) contained within a particular sinter-bonded backside via structure. Imparting the sinter-bonded backside via structure with such physical characteristics yields not only robust (high bond strength, separation resistant) bonding between these layers, but further provides low electrical and thermal resistance paths extending from a frontside region of a given IC die, through the sinter-bonded backmetal via structure, and to the electrically-conductive substrate, which may serve as a (e.g., ground or source) terminal of the die-substrate assembly in embodiments. The die-substrate assembly may consequently enhance the overall durability, electrical performance aspects, and thermal performance aspects of a larger microelectronic device (package or module) into which the die-substrate assembly is ultimately incorporated. Such benefits may be particularly useful in embodiments in which a power amplifier (PA) transistor or other circuitry prone to excess heat generation is integrated into the IC die or dies contained in the die-substrate assembly, while the electrically-conductive substrate is a metallic base flange or similar structure serving as both a terminal and a heatsink of the PA device (package or module) into which the die-substrate assembly is integrated.

As indicated above, embodiments of the die-substrate assembly are advantageously fabricated to maximize filling of the plated backside via (or vias) of an IC die with the sintered bond material, which is utilized to attach the IC die to an electrically-conductive substrate. Additional technical challenges are encountered, however, when attempting to achieve relatively complete (low void) filling of one or more plated backside vias with a selected sinter precursor material, which is subsequently processed (e.g., dried and sintered) to produce the sintered bond layer. Such technical challengers may be exacerbated when further attempting to maintain relatively precise control over the bond line thickness of the resulting sintered bond layer; e.g., that is, the average thickness of the sintered bond layer between the substrate-facing backside surface of the backmetal layer and the die support surface of the electrically-conductive substrate, as taken along an axis perpendicular to the substrate frontside. Further addressing such technical challenges, methods for the fabrication of die-substrate assemblies are further disclosed, with such fabrication methods promoting the ingress of sinter precursor material into one or more plated backside vias formed in at least one IC die. In implementations of the fabrication method, a sinter precursor material may be deposited into at least one backside via formed in an IC die, potentially while the IC die remains interconnected with a plurality of other presingulated IC dies in wafer form. The sinter precursor material may likewise be deposited into other backside vias formed in the other presingulated IC die, with sintering of the precursor material performed prior to or following wafer singulation. During such processes, certain steps may be taken to promote ingress of a sinter precursor material (e.g., a wet state paste) into the respective interiors of the plated backside vias. Examples of such steps include formulation of the sinter precursor material to possess a relatively low viscosity and/or to readily wet the backside via lining. Additionally or alternatively, the sinter precursor material may be deposited under vacuum, while local deposition techniques (e.g., needle dispense, screen printing, or writing) may be performed to urge inflow of the sinter precursor material into the backside vias.

In certain embodiments, multiple depositions steps may be performed to deposit different bodies of sinter precursor material in a sequential or multi-stage manner. In one fabrication approach, a local deposition step is initially performed to locally deposit discrete bodies of a selected sinter precursor material (herein, a "via fill precursor material") into the backside vias during processing of one or more wafers (herein, a "device wafer structure"). Sintering may or may not be carried-out immediately following this local deposition step to transform the via fill (VF) sinter precursor material into VF sintered bodies; the VF sintered bodies generally tantamount to (e.g., largely forming) the portions of the sintered bond layer occupying the backside via or vias in a particular sinter-bonded backside via structure when completed. Wafer singulation is subsequently conducted, and a second deposition step is performed to deposit a second body of sinter precursor material (herein, the "die attach sinter precursor material") over the backside of each singulated IC die and into the backside via or vias therein. Following this, an electrically-conductive substrate is brought into contact with the die attach (DA) sinter precursor material, and sintering is conducted to transform the DA sinter precursor material into a first portion or region of the sintered bond layer; herein, the "DA sintered region" of the sintered bond layer. Such a sintering step may also transform the initially-deposited bodies of VF sinter precursor material into sintered VF bodies occupying the backside vias if the VF sinter precursor material has not yet been fully sintered. Jointly, the DA sintered region and the VF sintered region (or bodies) form the sintered bond layer, which cooperates with the plated backside via and the backmetal layer to produce the sinter-bonded backside via structure through which the IC die is attached to the underlying electrically-conductive substrate, as previously discussed.

The above-outlined multi-stage approach for depositing the sinter precursor material provides several advantages. As one benefit, initial deposition of a VF sinter precursor material into the plated backside vias promotes efficient manufacture and low void filling of the backside vias, particularly when such an initial deposition process is performed under vacuum, at elevated temperatures, and/or under other controlled processing conditions. Second, such a multi-stage deposition process allows variance in the formulation of the VF sinter precursor material relative to the DA sinter precursor material, while ensuring chemical compatibility between the VF sinter precursor body and DA sinter precursor body produced following sintering. In the former regard, such an approach also allows the VF sinter precursor material to be uniquely tailored to possess a lower viscosity, a greater surface wettability, and/or a smaller average metallic particle size as compared to the subsequently-deposited DA sinter precursor material. Such attributes may promote relatively complete, low void filling of the backside vias by the VF sinter precursor material. Comparatively, the DA sinter precursor material may be formulated to possess a higher viscosity and/or a greater particle size facilitating precise control over the bond line thickness of the finished sintered bond layer. The VF sinter precursor material and the DA sinter precursor material may also differ in metallic particle composition or in other respects in such embodiments, as further discussed below. These advantages notwithstanding, a single stage deposition approach can be employed in other implementations to globally deposit a continuous (unpatterned or patterned) layer of sinter precursor material over the backmetal layer and the plated backside via(s) for at least one IC die, with sintering subsequently performed to produce the sintered bond layer attaching the IC die to an electrically-conductive substrate. Such fabrication approaches are discussed more fully below in connection with FIGS. 2-10. First, however, a general description of an example die-substrate assembly having a sinter-bonded backside via structure, as illustrated in a completed state prior to integration into a larger package or module, is set-forth below in connection with FIG. 1.

Example Die-Substrate Asssembly Having a Sinter-Bonded Backside Via Structure

FIG. 1 is a simplified cross-sectional view of a die-substrate assembly 20 containing a sinter-bonded backside via structure 22, as illustrated in accordance with an example embodiment of the present disclosure. In addition to sinter-bonded backside via structure 22, die-substrate assembly 20 also includes at least one IC die 24 into which circuitry, such as a power amplifier circuit containing at least one field effect transistor (FET), has been integrated. As discussed more fully below, IC die 24 is bonded to an electrically-conductive substrate 30 through an intervening sintered bond layer 32. In the illustrated example, electrically-conductive substrate 30 assumes the form of a metallic base flange and is consequently referred to hereafter as "base flange 30." In other instances, the electrically-conductive substrate of die-substrate assembly 20 may assume another form, such as that of an electrically-conductive (e.g., metallic) coin or block embedded in a printed circuit board (PCB), a coreless substrate, or another dielectric (e.g., ceramic) body. For clarity, only a limited portion of metallic base flange 30 is shown in FIG. 1, with the illustrated region including a segment of the die-facing frontside or die support surface 36 of base flange 30 to which IC die 24 is bonded. Any number of additional IC dies or other microelectronic components, such as surface mount devices (SMDs), may be attached to the other non-illustrated portions of base flange 30 in embodiments, depending upon the desired circuit architecture of die-substrate assembly 20. When one or more additional IC dies are attached to base flange 30, such additional IC dies may, but need not necessarily contain a sinter-bonded backside via structure similar or identical sinter-bonded backside via structure 22 described below.

Base flange 30 can be realized as a unitary body of material, a layered or laminated structure, or other electrically-conductive substrate suitable for supporting IC die 24 and, perhaps, one or more additional IC dies. Additionally, base flange 30 may serve as a heatsink and/or an electrically-conductive terminal when die-substrate assembly 20 is integrated into a microelectronic (e.g., power amplifier) package or module, which is, in turn, installed within a larger electronic system or device. By way of example, base flange 30 may assume the form of a monolithic metallic structure, plate, or slug in certain implementations. In other implementations, base flange 30 may have a multilayer metallic construction; e.g., base flange 30 may contain multiple thermally-conductive layers, which are bonded in a stacked or laminated arrangement Often, base flange 30 will be composed predominately of one or more metals having relatively high thermal conductivies, such as Cu. As a more specific example, in an embodiment wherein base flange 30 is a layered or laminated structure, base flange 30 may include at least one Cu layer combined with at least one disparate metal layer having a Coefficient of Thermal Expansion (CTE) less than that of the Cu layer. The disparate metal layer may be composed of, for example, molybdenum (Mo), a Mo—Cu alloy, or a Mo—Cu composite material. In this manner, base flange 30 may be imparted with both a relatively high thermal conductivity and a lower effective CTE. In embodiments, base flange 30 may include a non-illustrated upper plated layer or coating to enhance bonding with sintered bond layer 32. In other embodiments, die support surface 36 of metallic base flange 30 may be left bare, or base flange 30 may otherwise differ from the present example.

IC die 24 includes opposing principal surfaces or sides 26, 28, which are referred to herein as "frontside 26" and "backside 28," respectively. Frontside 26 is opposed to backside 28 as taken in a thickness direction of IC die 24; that is, along an axis orthogonal to die frontside 26 and to die backside 28, corresponding to the Z-axis of coordinate legend 44 shown in the bottom left of FIG. 1. IC die 24 is mounted to base flange 30 in a non-inverted orientation such that die backside 28 faces the frontside or die support surface 36 of metallic base flange 30. A backmetal layer 34 is formed over backside 28 of IC die 24 and may span die backside 28 in its entirety or substantial entirety; the term "backmetal layer," as appearing herein, encompassing both single layer structures and multi-layer systems containing multiple sublayers, which are formed over backside (non-active side) of an IC die, such as IC die 24. For example, in embodiments, backmetal layer 34 may be composed of a single layer deposited over a relatively thin, metallic seed layer, which is initially sputter deposited or otherwise formed over backside 28 of IC die 24 and which extends into the below-described backside via 38 to coat the interior sidewalls of the backside via and thereby form the below-described via lining or plating. In other instances, backmetal layer 34 may be composed of a single metallic layer deposited over the desired surfaces of IC die 24 after surface activation. In still other embodiments, backmetal layer 34 may be composed of multi-plated sublayers build-up over die backside 28 by, for example, electroplating. In many instances, backmetal layer 34 may be predominately composed of gold (Au), by weight; and may contain lesser amounts of metallic or non-metallic constituents, such as Cu or sliver (Ag). This stated, the particular composition of backmetal layer 34, and the manner in which backmetal layer 34 is formed over IC die backside 28, is largely inconsequential to embodiments of the present disclosure, providing that backmetal layer 34 and sintered bond layer 32 are chemically compatible and amenable to metallurgical bonding, as further discussed below.

At least one plated backside via 38 penetrates into the semiconductor-containing body of IC die 24 from the backside thereof. Plated backside via 38 may extend into the body of IC die 24 to terminate at an electrically-conductive feature 46, such as a contact pad, located within a frontside region of IC die 24; e.g., a metallic feature contained in the below-described frontside build-up layers 66, 68 formed over the frontside of the semiconductor-containing body of IC die 24. This feature 46 (hereafter, "via termination contact 46") serves as an internal terminal, electrode, or electrically-active element of IC die 24, which is electrically coupled to the circuitry integrated into IC die 24 (generically represented in FIG. 1 by a dashed box 48 and containing one or more transistor utilized for RF signal amplification purposes in embodiments). The region surrounding the primary opening of plated backside via 38 (that is, the opening or rim of backside via 38 formed in backside 28 of IC die 24) is referred to herein as a "mouth region" and is identified by reference numeral 42 in FIG. 1. The interior surfaces of plated backside via 38 are coated by at least one plating layer or "backside via lining 40," which intimately contacts and which is metallurgically bonded to sintered bond layer 32 about at least mouth region 42 of backside via 38. In various implementations, backside via lining 40 may be integrally formed with backmetal layer 34 as a continuous, globally-deposited metallic backside via lining 40. In such implementations, backside via lining 40 and backmetal layer 34 may be integrally formed by, for example, globally electroplating a metallic backside via lining 40 over IC die 24 and multiple other dies when interconnected as a device wafer structure, an example of which is discussed below in connection with FIG. 5.

As noted above, sintered bond layer 32 contacts, and is metallurgically bonded to, backside via lining 40 about at least the mouth region 42 of plated backside via 38. In embodiments, sintered bond layer 32 is advantageously formed to extend into the interior of plated backside via 38 to occupy or fill at least a portion, if not the substantial entirety of the interior volume of backside via 38. In this regard, and as indicated in FIG. 1, sintered bond layer 32 may be produced to fill a volumetric majority of plated backside via 38 (that is, more 50% of the interior volume of backside via 38) or, perhaps, the substantial entirety of plated backside via 38 (that is, at least 90% of the interior volume of backside via 38) in at least some embodiments of die-substrate assembly 20. Such relatively complete or thorough filling of plated backside via 38 by sintered bond layer 32 maximizes the surface area along which bond layer 32 is metallurgically bonded to backside via lining 40, while minimizing gas-filled void space 76 within backside via 38, to provide a high integrity, low electrical and thermal resistance interface between plated backside via 38, sintered bond layer 32, and metallic base flange 30. The region of sintered bond layer 32 extending into and occupying the interior of plated backside via 38 is referred to herein as the "sintered via fill portion" or "sintered VF portion" of sintered bond layer 32 and is specifically identified by reference numeral "32(a)" in the drawing figures. Comparatively, the main (more voluminous) body region of sintered bond layer 32, which is generally located between backmetal layer 34 and die support surface 36 of metallic base flange 30, is referred to herein as the "sintered die attach portion" of sintered bond layer 32 and is identified by reference numeral "32 (b)" in the accompanying drawing figures. Sintered die attach (DA) portion 32 (b) of sintered bond layer 32 thus contacts, and may be metallurgically bonded to, backmetal layer 34 and die support surface 36 of metallic base flange 30 to bond IC die 24 to base flange 30. Portions 32(a), 32(b) of sintered bond layer 32 may be substantially identical in composition and physical characteristics, such as microstructure; or, instead, may differ in composition and/or microstructure depending upon the manner in which sintered bond layer 32 is produced, with example fabrication processes discussed below in connection with FIGS. 2-10.

When containing one or more transistors, the transistor or transistors within IC 48 of die 24 may be realized as FETs, such as laterally-diffused metal oxide semiconductor (LDMOS) FETs. In embodiments, transistor-containing IC 48 integrated into IC die 24 may be implemented utilizing III-V semiconductor materials, such as gallium nitride (GaN), gallium arsenide (GaAs), GaP (gallium phosphide), an indium phosphide (InP), or indium antimonide (InSb). Various other material or material combinations in which ICs are suitably formed, whether including FETs, other transistors (e.g., bipolar transistors), or other circuit elements, can equivalently be utilized in further implementations. Additionally, IC die 24 may be fabricated utilizing any suitable semiconductor-material die structure including, for example, bulk silicon (Si) substrates, silicon-on-insulator (SOI) substrates, and diamond-based and glass-based substrates. In still other implementations, IC die 24 may be produced utilizing a high performance layered structure 56, 58, such as layered Gallium Nitride (GaN) structures and layered Gallium Arsenide (GaAs) structures. As a more specific example, and with continued reference to FIG. 1, IC die 24 may be fabricated utilizing a silicon carbide/gallium nitride (SiC/GaN) structure 56, 58 containing a SiC layer or portion 58 and an overlying GaN layer or portion 56. Further, in at least some instances, sintered bond layer 32 (and, specifically, sintered VF portion 32(a) of sintered bond layer 32) may be formed to extend from mouth region 42 of plated backside via 38, through SiC portion 58 of IC die 24, and into gallium nitride portion 56 of IC die 24, as generally shown in FIG. 1. Other layers may also be included in embodiments of SiC/GaN structure 56, 58, such as an additional layer 72 (e.g., an aluminum-containing GaN layer) formed over the upper surface of GaN layer 56.

Various electrically-conductive bodies 64, such as filled or plated vias, metal plugs, or other such patterned metal features (e.g., a field plate feature 70), may be formed in dielectric layers 66, 68 overlying the body of IC die 24. Electrically-conductive bodies 64 electrically connect terminals or electrodes 46, 60, 62 of IC 48 to a number of bond pads 50, 52, 54, which form an input/output (I/O) interface accessible from the frontside of IC die 24. Such electrically-conductive (e.g., patterned metal) features are shown in a simplified form in the schematic of FIG. 1 and can vary in complexity to, for example, best suit the layout of the (e.g., transistor-containing) IC 48 integrated into IC die 24. Each bond pad type included in bond pads 50, 52, 54 (e.g., signal input, current supply, and current return bond pads) may be electrically coupled to a corresponding active transistor region of IC 48 in embodiments. Specifically, and again referring to an example embodiment in which IC 48 contains one or more FETs, bond pad 50 may be a source bond pad electrically coupled to metal features included in a patterned metal layer; e.g., the "source terminals" or the "source metal" providing contact to the doped source regions of IC 48 when containing one or more FETs. Bond pad 52 may be a gate bond pad electrically coupled to corresponding metal features included in or below a patterned metal layer; e.g., the "gate terminals" overlying the channel-formation regions of the FET or FETs contained in IC 48. Finally, bond pad 62 may be a drain bond electrically coupled to corresponding metal features included in a patterned metal layer; e.g., the "drain terminals" providing ohmic contact to doped drain regions of the FET or FETs contained in IC 48. Metallic base flange 24 may itself serve as a ground terminal of die-substrate assembly 20.

As previously indicated, sinter-bonded backside via structure 22 is beneficially fabricated such that plated interior surfaces or metallic lining 40 of plated backside via 38 are metallurgically bonded to sintered bond layer 32 about at least via mouth region 42; and, perhaps, such that sintered bond layer 32 penetrates more deeply into the interior of backside via 38 for metallurgical bonding with a greater fraction or percentage of backside via lining 40. In this regard, sintered bond layer 32 may contact, and form a metallurgical bond with, a majority of backside via lining 40 in embodiments, as measured by surface area. Similarly, in at least some instances and as noted above, the precursor material or materials utilized to produce sintered bond layer 32 may be deposited in sufficient quantity and processed under controlled conditions to fill a volumetric majority, if not the substantial entirety of the interior volume of backside via 38; the term "substantial entirety," as utilized in this context, denoting that the sintered bond layer fills at least 90% of the interior volume of a backside via. This may be appreciated by reference to FIG. 1 in which it can be seen that sintered bond layer 32, and specifically VF portion or region 32(a) of sintered bond layer 32, occupies a substantial entirety of the interior volume of backside via 38. The surface area availed for metallurgical bonding between sintered bond layer 32, backmetal layer 34, and metallic lining 40 of backside via 38 is thus maximized. As a corollary, void space 76 (e.g., filled with trapped air or other inert gasses) within sinter-bonded backside via structure 22 is minimized. Concurrently, DA portion 32(b) of sintered bond layer 32 is imparted with a desired bond line thickness, as indicated in FIG. 1 by double-headed arrow 74. In embodiments, the bond line thickness of sintered bond layer 32 may range from about 7 to about 100 microns (μm) and, perhaps, from about 15 to about 25 μm. In other instances, the bond line thickness of DA portion 32 (b) or, more generally, of sintered bond layer 32 may be thicker or thinner than the aforementioned range. By carefully controlling the bond line thickness of sintered bond layer 32 the mechanical (bond strength), electrical, and thermal properties of the sintered die attach interface may be further optimized.

By maximizing the volume or area along which sintered bond layer 32, backmetal layer 34, and metallic via lining 40, and by forming (formulating and processing) sintered bond layer 32 to readily form metallurgical (as opposed to adhesive) bonds with backmetal layer 34 and via lining 40, high strength joinder interfaces are created between IC die 24 and base flange 30. The resulting die substrate-assembly 20 thus exhibits an increased resistance to separation or other structural compromise along these interfaces over time and across repeated thermal cycling of IC die 24. Additionally, increasingly robust, low resistance thermal and electrical paths are provided from a frontside region of IC die 24, through sinter-bonded backside via structure 22, and to metallic base flange 30. When integrated into a larger microelectronic package or module, presently-disclosed die-substrate assembly 20 can improve the overall durability or reliability, electrical performance aspects, and thermal performance aspects of the resulting microelectronic package or module. Such attributes may be particularly beneficial when the microelectronic package assumes the form of a PA package containing one or more IC die utilized for RF signal amplification purposes. For example, in instances in which die-substrate assembly 20 is incorporated into a package having a Doherty PA architecture, IC die 24 may assume the form of a carrier RF die prone to excess heat generation during operation. Sinter-bonded backside via structure 22 may therefore provide not only a relatively robust electrical path to metallic base flange 30 (which may serve as a ground terminal and, perhaps, as a source terminal when IC 48 contains one or more FETs), but may also enable efficient thermal conduction from regions within and adjacent IC die 24, through the body of IC die 24 and sintered bond layer 32, and to base flange 30 (further serving as a heatsink or heat spreader). Similarly, in such instances, the Doherty PA package may also contain one or more peaking IC dies, which can potentially contain a similar or identical sinter-bonded backside via structure. Example methods for fabricating a number of die-substrate assemblies, which may be similar or identical to die-substrate assembly 20, will now be set-forth in connection with FIGS. 2-10.

Figure 2:
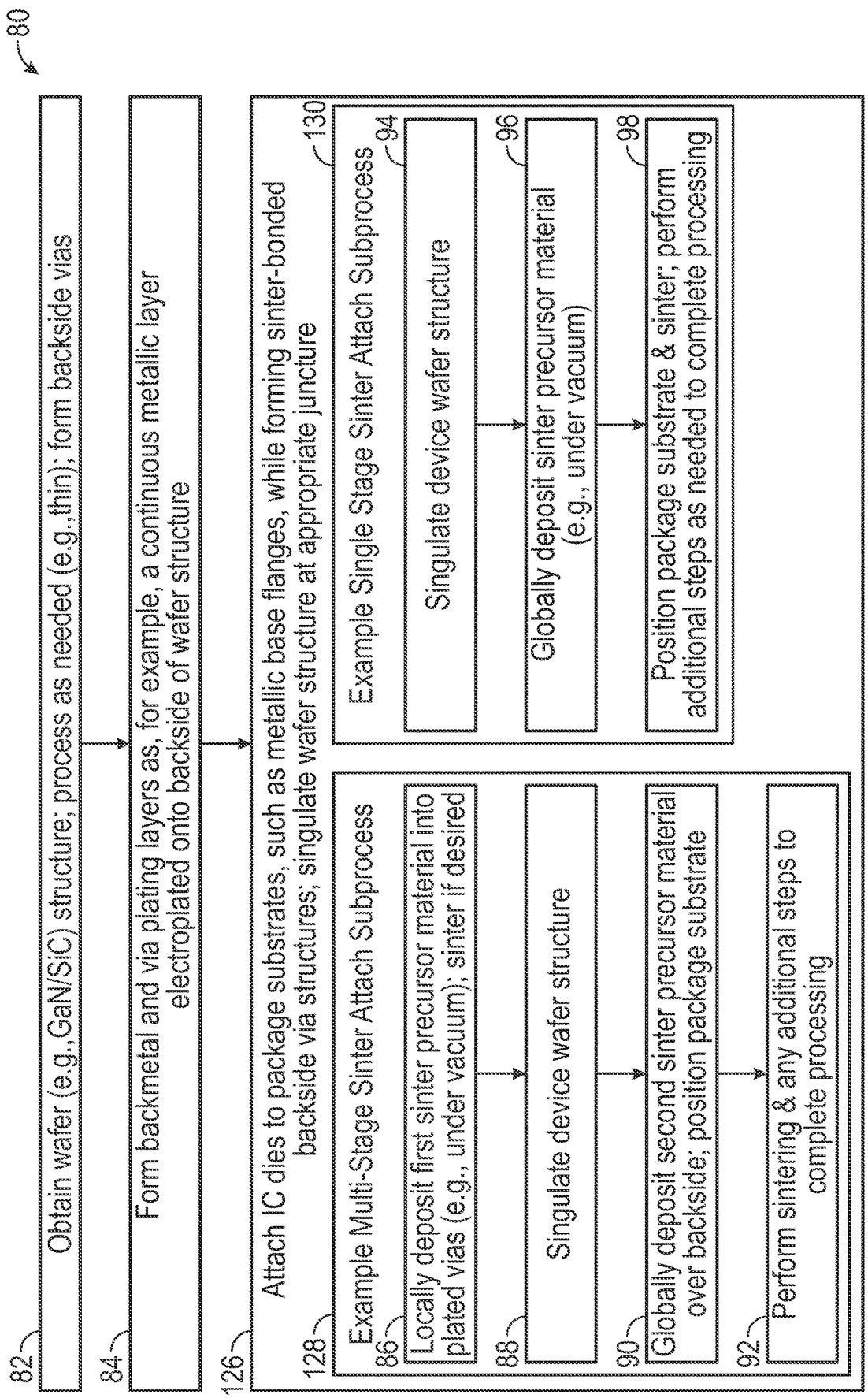
FIG. 2 is a flowchart presenting a method for fabricating a number of die-substrate assemblies each having a sinter-bonded backside via structure, which may be similar or identical to the sinter-bonded backside via structure shown in FIG. 1, as illustrated in accordance with an example embodiment of the present disclosure.

Example Method for Fabricating Die-Substrate Assemblies Having Sinter-Bonded Backside Via Structures Turning to FIG. 2, a generalized method 80 for fabricating a number of die-substrate assemblies is presented in accordance with an example embodiment of the present disclosure. For purposes of explanation, die-substrate assembly fabrication method 80 is principally described in connection with fabrication of die-substrate assembly 20 discussed above in connection with FIG. 1, with die-substrate assembly 20 shown at various stages of production in FIGS. 3-10. This example notwithstanding, die-substrate assembly fabrication method 80 can be utilized to fabricate other die-substrate assemblies including sinter-bonded backside via structures, which may differ relative to die-substrate assembly 20 in varying respects. For manufacturing efficiency, embodiments of die-substrate assembly fabrication method 80 are beneficially carried-out, at least in part, by processing of a device wafer structure to concurrently fabricate a relatively large number of die-substrate assemblies in parallel. In the illustrated example, fabrication method 80 includes a number of process STEPS 82, 84, 86, 88, 90, 92, 94, 96, 98 each of which is described, in turn, below. STEPS 86, 88, 90, 92, in particular, may be performed as a part of a multi-stage sinter attach subprocess 128 carried-out during die attach stage 126 of fabrication method 80. In other implementations of fabrication method 80, STEPS 94, 96, 98 may be performed as a part of a single stage sinter attach subprocess 130 carried-out during die attach stage 126, as further discussed below. Depending upon the particular manner in which die-substrate assembly fabrication method 80 is implemented, each step generically illustrated in FIG. 2 may entail a single process or multiple sub-processes. Further, the steps illustrated in FIG. 2 and described below are provided by way of non-limiting example only. In alternative embodiments of fabrication method 80, additional process steps may be performed, certain steps may be omitted, and/or the illustrated process steps may be performed in alternative sequences.

Die-substrate fabrication method 80 commences at STEP 82 as a device wafer structure is fabricated, purchased from a supplier, or otherwise obtained. As appearing herein, the term "device wafer structure" refers to a structure including at least one semiconductor wafer containing a plurality of presingulated IC dies (that is, portions of the wafer structure into which circuitry has been integrated), which are subsequently separated into individual units following singulation of the device wafer structure. A device wafer structure may thus assume the form of a single semiconductor wafer in embodiments; of a semiconductor wafer combined with a non-semiconductor wafer; or multiple bonded wafers as in the case of, for example, SiC/GaN device wafer structures of the type described below. If not previously performed, the device wafter structure may also be subject to additional processing steps during STEP 82 of die-substrate assembly fabrication method 80. Such process steps can include wafer thinning, the formation of backside via openings within the wafer structure, plating of the backside via openings to yield plated backside vias 38, and formation of backmetal layers over the presingulated IC dies, as further discussed below in connection with FIGS. 3-5.

Figure 3:
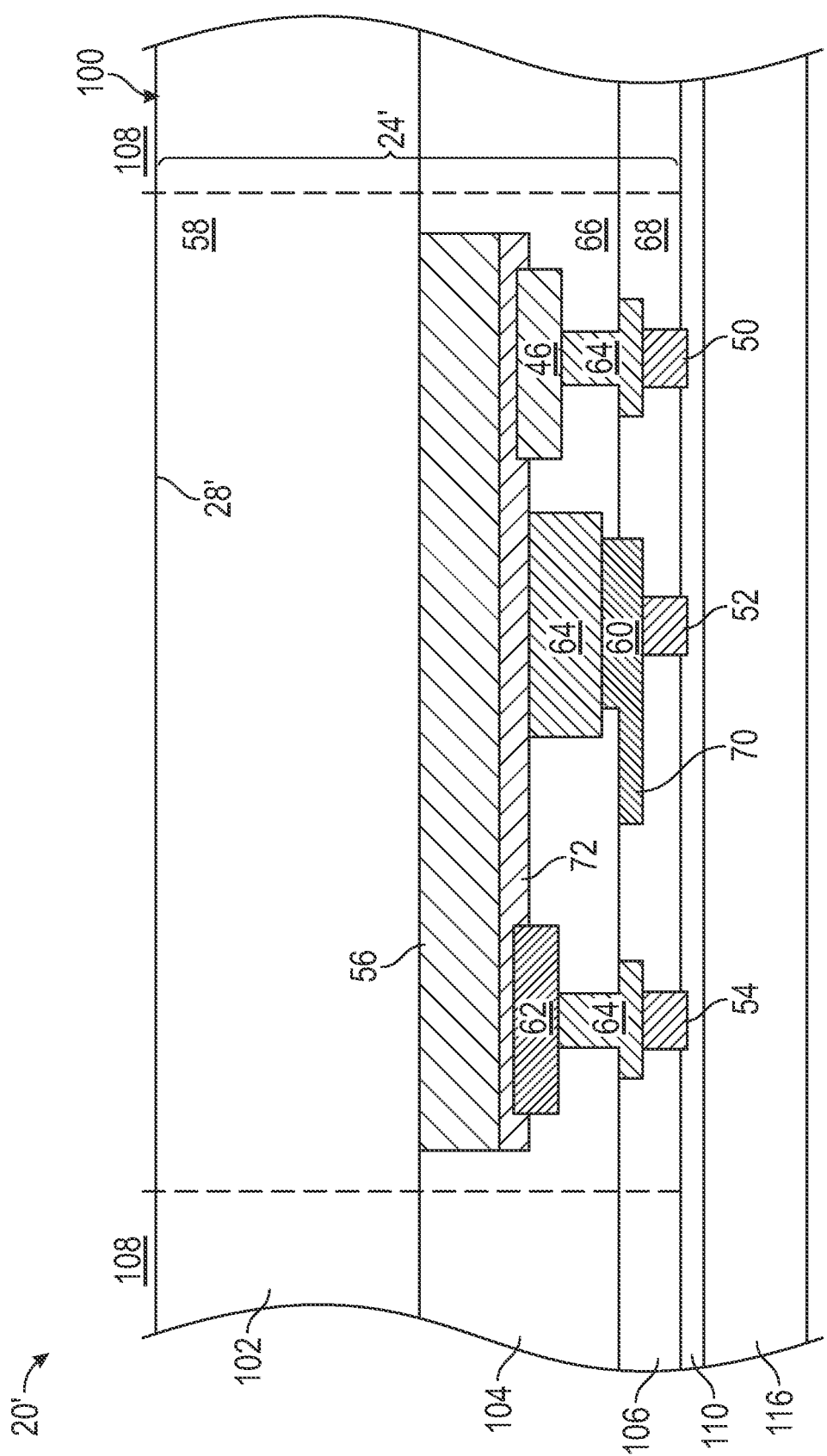
FIGS. 3-10 illustrate a die-substrate assembly at various stages of production and fabricated to include a sinter-bonded backside via structure in accordance with the example die-substrate assembly fabrication method set-forth in FIG. 2.
Figure 4:
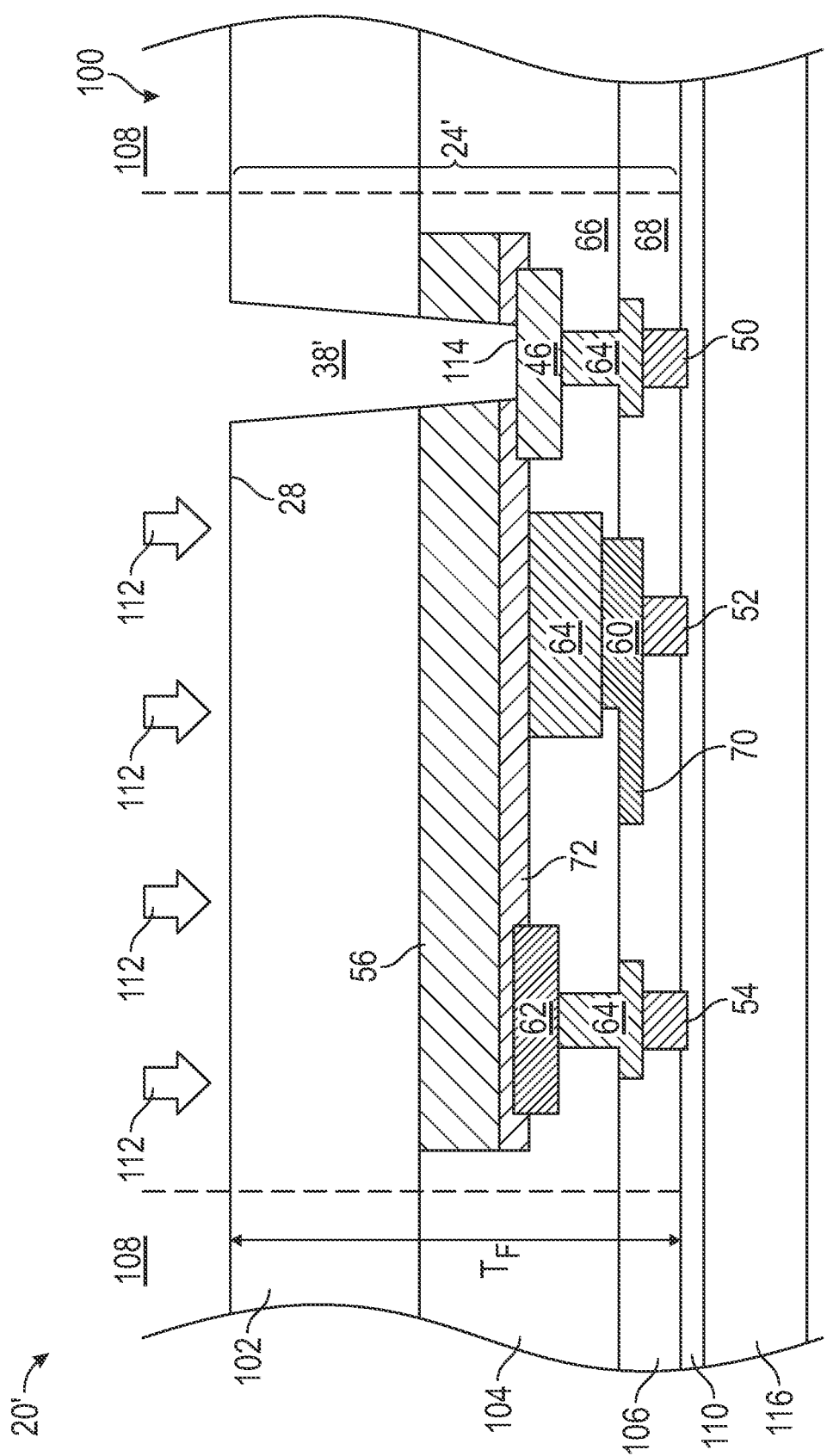
Figure 5:
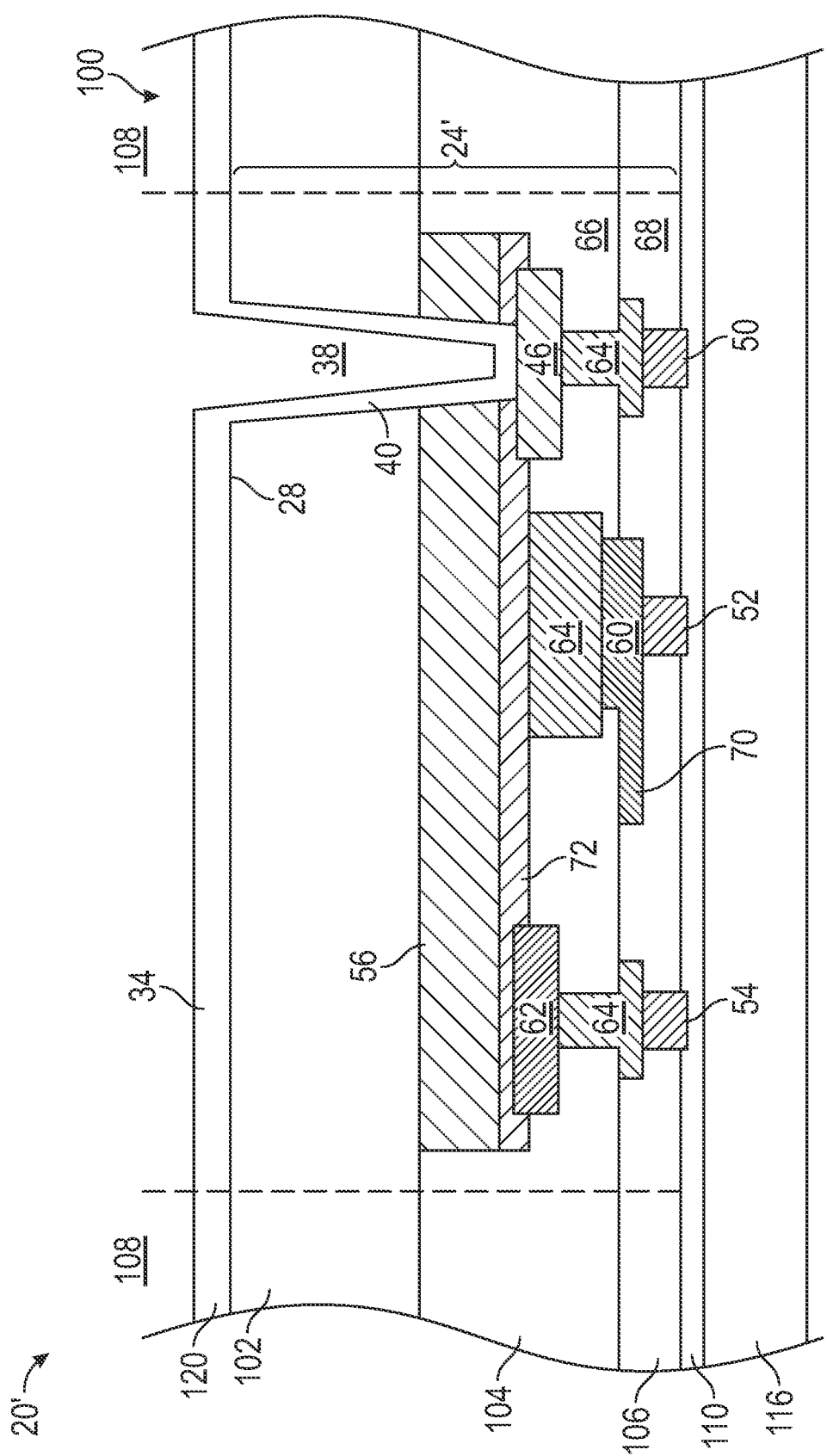
Figure 6:
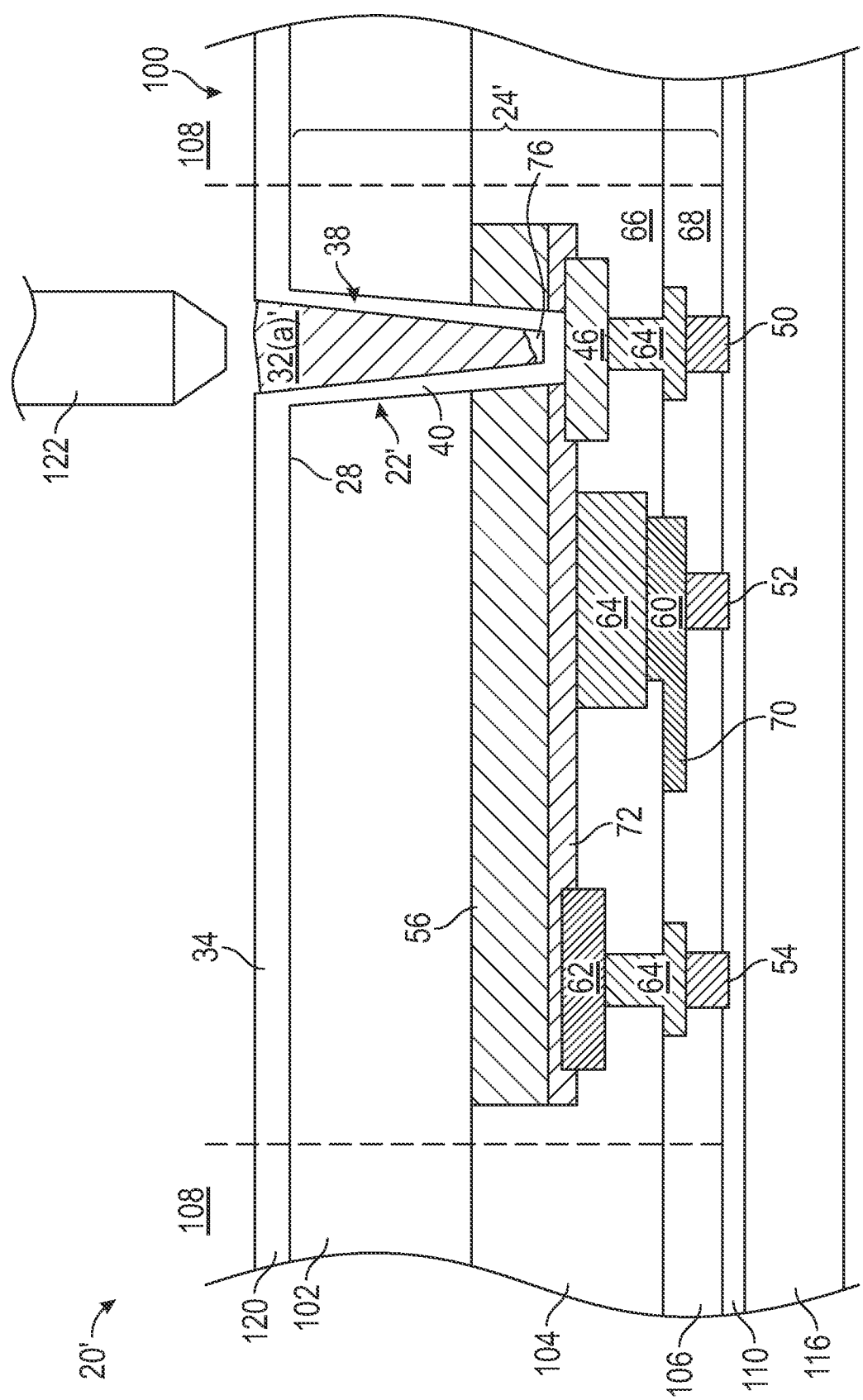

FIG. 3 illustrates a limited portion of a device wafer structure 100, which may be obtained during STEP 82 of method 80 in an embodiments. The illustrated portion of device wafer structure 100 encompasses die-substrate assembly 20, which is depicted in a partially-fabricated state in FIG. 3 and in FIGS. 4-10. A prime symbol (') is appended to die-substrate assembly 20', as shown in FIG. 3-10, to indicate that die-substrate assembly 20' is shown in a partially-completed state (as contrasted against die-substrate assembly 20 shown in a completed state FIG. 1). In the present example, device wafer structure 100 is a multi-layer SiC/GaN device wafer structure composed of a SiC wafer 102, a GaN wafer 104, and global (wafer level) frontside build-up layers 106 formed over the frontside of GaN wafer 104 during prior processing of wafer structure 100. At this juncture in the fabrication process, device wafer structure 100 is inverted such that the frontside of wafer structure 100 faces a (e.g., glass) carrier 116 to which wafer structure 100 is attached utilizing an adhesive (e.g., ultraviolet tape) layer 110. As noted above, only a limited portion of device wafer structure 100 is shown in FIG. 3, which generally corresponds to the portion of device wafer structure 100 processed to yield die-substrate assembly 20 and the surrounding peripheral singulation lanes (e.g., saw streets) 108. It will be appreciated that the structure generally shown in FIG. 3 is depicted in a simplified, cartoon-like form and is further repeated across device wafer structure 100. The below-described process steps are thus performed across device wafer structure 100 to concurrently produce, or at least partly produce, several dozen or more die-substrate assemblies in parallel.

During STEP 82 of fabrication method 80, device wafer structure 100 may be processed by, for example, thinning wafer 100 to a desired final thickness. As represented by arrows 112 in FIG. 4, device wafer structure 100 (and, more specifically, SiC wafer 102) can be thinned by grinding, lapping, polishing (e.g., chemical mechanical polishing), or any combination thereof. The thickness removed from device wafer structure 100 will vary among embodiments, as will the final average thickness of wafer structure 100. Device wafer structure 100 is illustrated after thinning as having a final average thickness of $T_1$, which may be less than 4 mils (101.6 μm) in embodiments. In other instances, the final thickness of device wafer structure 100 may be greater than the aforementioned thickness. Thinning of device wafer structure 100 reveals a new (thinned or ground) backside surface, as identified by reference numeral 28. Following wafer thinning, and as further indicated in FIG. 4, backside via openings 38' may be formed through device wafer structure 100 at selected locations corresponding to IC die 24' and the other interconnected or presingulated IC die making-up wafer structure 100; the term "via opening" referring to the void space defining a backside via prior to formation of the electrically-conductive lining or internal plating over the inner via sidewalls. As an example, backside via openings 38' may be produced utilizing a high aspect ratio etching technique, such as a deep reactive ion etching process, in certain implementations. The frontside via contacts (e.g., via termination contact 46) are conveniently leveraged as an etch stop features when forming backside via openings 38' in this manner. In other embodiments, backside via openings 38' may be formed in another manner, providing the backside via openings 38' extend into the respective thicknesses of the IC dies contain in device wafer structure 100 to enable electrical contact to the corresponding frontside via contacts (e.g., contact pad 46 in the case of IC die 24') following deposition of one or more electrically-conductive layers or linings, such as the global (wafer level) electroplated layer 120 described below in connection with FIG. 5.

Die-substrate assembly fabrication method 80 (FIG. 2) next advances to STEP 84 during which the backmetal layers and via plating layers or linings are formed across the backside of device wafer structure 100 and, therefore, the respective across backsides of the presingulated IC dies contained in wafer structure 100. In embodiments, the backmetal and via plating layers (e.g., backmetal layer 34 and via plating layer 40 of die-substrate assembly 20') are advantageously formed as a single, continuous metallic layer, which is electroplated or otherwise deposited over the backside of wafer structure 100. This may be appreciated by reference to FIG. 5, which illustrates partially-fabricated IC die 24' after deposition of a wafer-spanning electroplated layer 120 across the wafer backside and, therefore, over backsides of the presingulated IC dies and into the backside via opening 38 formed therein. Focusing on the illustrated region of device wafer structure 100 encompassing IC die 24', specifically, this results in the creation of die-level backmetal layer 34 and backside via lining 40 as a continuous electroplated layer, thereby transforming backside via opening 38' into plated backside via 38. Similar backmetal layers and via lining layers are concurrently produced for the other non-illustrated IC die contained in device wafer structure 100.

As previously indicated, electroplated layer 120 (concurrently forming backmetal layers 34 and backside via linings 40 across the presingulated IC dies contained within device wafer structure 100) may be produced by initially depositing a relatively thin seed layer utilizing, for example, a sputter deposition process; and subsequently plating wafer-spanning electroplated layer 120 to a desired material thickness. In such instances, electroplated layer 120, and therefore backmetal layers 34 and backside via linings 40, may be predominately composed of Au, by weight, with electroplated layer 120 potentially lesser amounts metallic or non-metallic constituents, such as lesser amounts of Cu or Ag. In other instances, the layer or layers making-up backmetal layers 34 and backside via linings 40 may be deposited utilizing another (e.g., plating) technique; and/or electroplated layer 120 may be imparted with another composition or structure, providing backmetal layers 34 and backside via linings 40 are chemically compatible with selected sinter die attach material, as further described below in connection with FIGS. 6-10. As a further possibility, backmetal layers 34 and backside via linings 40 may be separately formed in further implementations of method 80 (FIG. 2) depending upon, for example, the stage of manufacture at which plated backside vias 38 are formed.

Next, during the die attach stage 126 of die-substrate assembly fabrication method 80 (FIG. 2), a subprocess is performed to attach the IC dies contained in device wafer structure 100 to corresponding electrically-conductive substrates, such as metallic base flanges similar or identical to base flange 30 (FIG. 1), while forming sinter-bonded backside via structure 22 and while singulating wafer structure 100 at any suitable juncture in the manufacturing process. Two example subprocesses 128, 130 are outlined in the example method 80 of FIG. 2. Initially addressing subprocess 128, this subprocess (herein, a "multistage sinter deposition subprocess 128") involves multiple depositions steps performed to deposit different bodies or volumes of sinter precursor material in a multi-stage manner. In this regard, a deposition step may be initially performed to locally deposit discrete bodies of sinter precursor material 32(a)' (again, referred to herein as the "VF sinter precursor material") into plated backside vias 38 during processing of device wafer structure 100 in a presingulated state.

VF sinter precursor material 32(a)' can be applied utilizing either a wet state or dry state application technique. Wet state application techniques suitable for application of VF sinter precursor material 32(a)' include, but are not limited to, screen or stencil printing and fine needle dispense techniques, with an example dispense nozzle or tool 122 shown in FIG. 6 (not drawn to scale). As illustrated, VF sinter precursor material 32(a)' may be deposited in sufficient volume to at least partially fill and, perhaps, to fill a majority, if not the substantial entirety of the interior space or volume of plated backside via 38. Dispense tool 122 may then be moved to other locations to dispense additional bodies of VF sinter precursor material 32 (a)' filling the other non-illustrated plated backside vias contained in device wafer structure 100 in a similar manner. In other instances, a different technique may be utilized to locally deposit VF sinter precursor material 32(a)', such as a screen printing technique in which opening are formed in the screen at locations corresponding to plated backside vias 38 and a relatively large volume of VF sinter precursor material 32(a)' is then spread over the screen or stencil utilizing a specialized squeegee or similar tool. In embodiments, such deposition techniques may be performed under partial vacuum to encourage inflow of the liquid state sinter precursor material 32(a)' into backside vias 38; e.g., by placing device wafer structure 100 in a vacuum chamber, drawing a vacuum (to lessen trapped air pressure within the backside via interior), and conducting the selected deposition process. Additionally or alternatively, plasma cleaning or a similar technique may be performed to increase the wettability of inner via lining 40 prior to the deposition of VF sinter precursor material 32(a)'. Deposition of VF sinter precursor material 32(a)' may also be performed at elevated temperatures in embodiments to further reduce viscosity or lower air pressures to promote via inflow of the sinter precursor material, as further discussed below.

The formulation of VF sinter precursor material 32(a)' can vary between embodiments, providing that sinter precursor material 32(a)' contains a metallic particle content suitable for sintering to yield sintered VF regions 32(a) included in the respective sintered bond layers 32 of IC dies 24', as described above in connection with FIG. 1. In embodiments, VF sinter precursor material 32(a)' may contain other ingredients (e.g., a solvent and/or surfactant) to facilitate wet state application, to adjust the viscosity of the precursor material, to prevent premature agglomeration of the metal particles, to enhance surface wettability, or to serve other purposes. In one embodiment, wet state VF sinter precursor material 32(a)' contains metal particles in combination with a binder (e.g., an epoxy), a dispersant, and a thinner or liquid carrier. The volume of solvent or liquid carrier contained within the sinter precursor material 32(a)' can be adjusted to tailor the viscosity of VF sinter precursor material 32(a)' to the selected wet state application technique. For example, in an implementation in which sinter precursor material 32(a)' is desirably applied by screen printing, writing, or fine needle dispense, VF sinter precursor material 32(a)' may contain a sufficient fraction of liquid to create a paste, slurry, or paint having a desired viscosity. In embodiments, VF sinter precursor material 32(a)' may be formulated to possess a lower viscosity than does the below-described DA sinter precursor material 32(b)' by, for example, increasing the liquid content of sinter precursor material 32(a)' relative to the below-described DA sinter precursor material 32(b)'; e.g., in certain cases, the formulation of sinter precursor material 32(a)' may differ only slightly relative that of DA sinter precursor material 32(b)' by having a moderately higher liquid carrier content or otherwise differing from precursor material 32 (b)' in one or more of the manners discussed below. This, in turn, may promote inflow of sinter precursor material 32(a)' into the interior of plated backside vias 38. After application of wet state VF sinter precursor material 32 (a)', a drying process can be carried-out to remove excess liquid from the bond layer precursor material or an organic burn-out step may be performed, if so desired. In further embodiments, VF sinter precursor material 32(a)' can be applied in another manner, such as utilizing a dry state application technique.

While depicted as filling the substantial entirety of the interior of plated backside via 38 up to approximately the mouth region of backside via 38 in the illustrated example, sinter precursor material 32(a)' need not be dispensed in sufficient volume to completely fill plated backside via 38 in all instances. In such embodiments, the subsequently-deposited DA sinter precursor material 32(b)' may help fill-in any gaps or accommodate any surface irregularities (uneven topologies) of sinter precursor material 32 (a)', particularly when DA sinter precursor material 32 (b)' is applied in a wet state. Conversely, while further depicted as largely confined to backside via 38 in the generalized example of FIG. 6, sinter precursor material 32 (a)' may be deposited in a greater volume in alternative implementations to effectively overflow and spill from the mouth region of backside via 38 to some extent. Further, the initial sinter precursor material deposition technique can be utilized to deposit a greater volume of sinter precursor material in embodiments to, for example, create a thin layer of precursor material covering backmetal layer 34, with one (or possibly more) additional layers of sinter precursor material subsequently deposited to build-up sintered bond layer 32 to a desired bond line thickness, accommodating some level of displacement, shrinking, or compression of sinter precursor material during position of base flange 30 and sintering or other processing steps (e.g., drying or organic burnout), as further discussed below. Moreover, such subsequently-deposited layers of sinter precursor material may be imparted with greater viscosity as compared to sinter precursor material 32(a) to enable improved control over the bond line thickness of sintered bond layer 32.

Regardless of whether VF sinter precursor material 32(a)' (FIG. 9) is applied in a dry state or in a wet state, such as a metal particle-containing paste, the metal particles dispersed within sinter precursor material 32 (a)' can have any composition, shape, and size enabling the particles to form a substantially coherent adhesive layer pursuant to the below-described sintering process. In one embodiment, VF sinter precursor material 32(a)' contains Au, Ag, or Cu particles, or a mixture thereof. In another embodiment, the metal particles contained within VF sinter precursor material 32 (a)' consist essentially of Ag particles, Cu particles, or a combination thereof. The metal particles contained within sinter precursor material 32 (a)' may or may not be coated with an organic material. For example, in some implementations, the metal particles may be coated with an organic dispersant, which prevents or minimizes physical contact between the particles to inhibit premature agglomeration and particle sintering. When present, any such organic particle coating may be burned away or thermally decomposed, whether in whole or in part, during the below-described metal sintering process. In still further embodiments, other material systems amenable to low temperature sintering, whether currently known or later developed, may be utilized in the fabrication process. Additionally, in certain instances, VF sinter precursor material 32(a)' may be formulated to contain solvents or other constituents increasing the degree to which VF sinter precursor material 32(a)' wets the material from which inner via lining 40 is composed.

The metal particles contained within VF sinter precursor material 32(a)' (FIG. 6) can have any shape or combination of shapes including, but not limited to, spherical shapes, oblong shapes, and platelet or laminae shapes. The average dimensions of the metal particles will vary in conjunction with particle shape and process parameters. However, in general, the average maximum dimension of the metal particles (e.g., the diameter of the metal particles when spherical or the major axis of the metal particles when oblong) may be between about 100 μm and about 10 nanometers (nm) in an embodiment. In other embodiments, the metal particles may have average maximum dimensions greater than or less than the aforementioned range. In certain implementations, a mixture of metal particles having average maximum dimensions in both the nanometer and micron range may be present within the precursor material. In other implementations, only nanoparticles (that is, particles having average maximum dimensions between 1 and 1000 nm) may be contained within VF sinter precursor material 32 (a)'. As a specific, albeit non-limiting example, VF sinter precursor material 32(a)' may contain at least one of Ag, Au, or Cu nanoparticles or micron-sized particles in an embodiment, with Ag or Cu nanoparticles utilized in at least some implementations.

Figure 7:
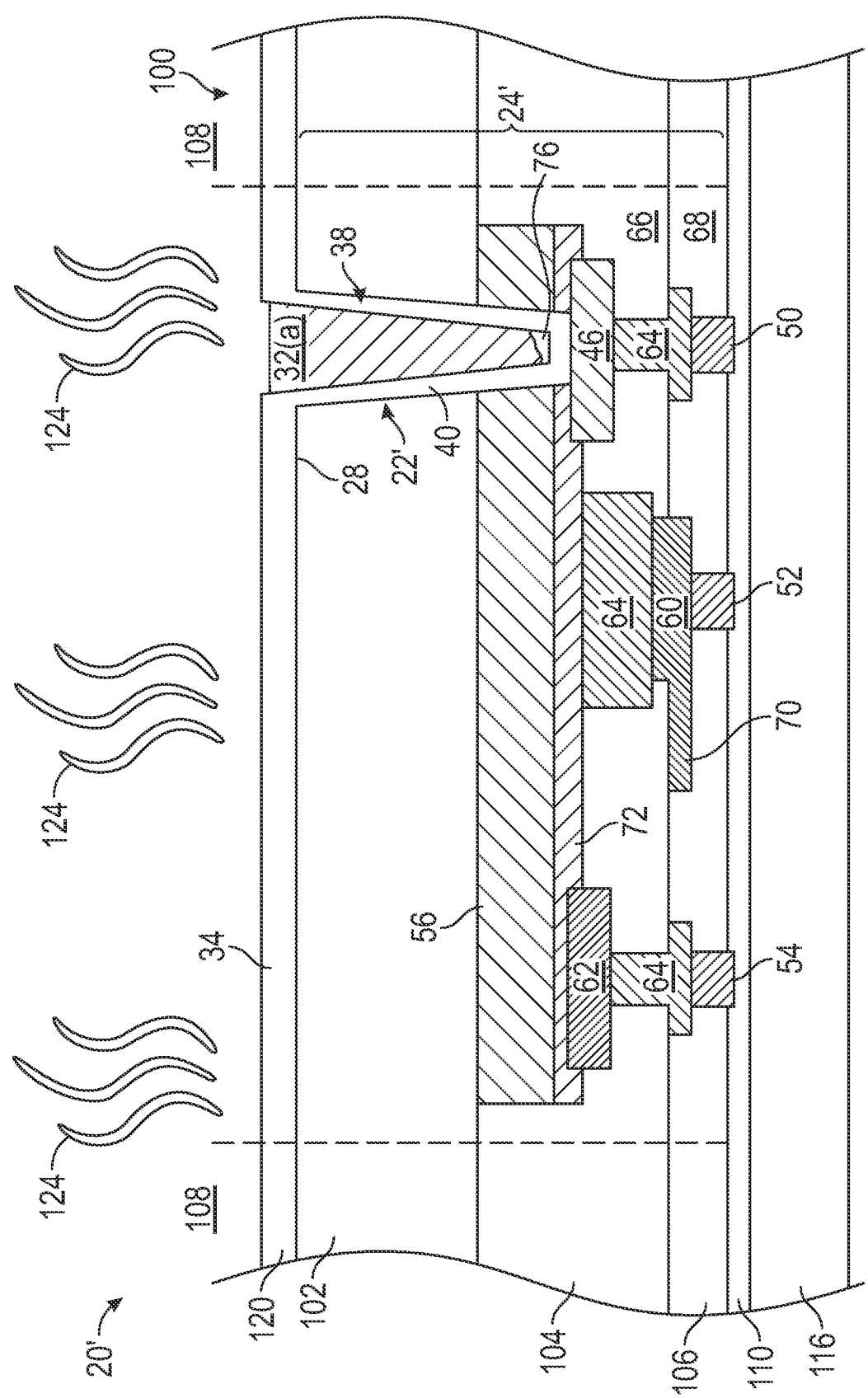
Figure 8:
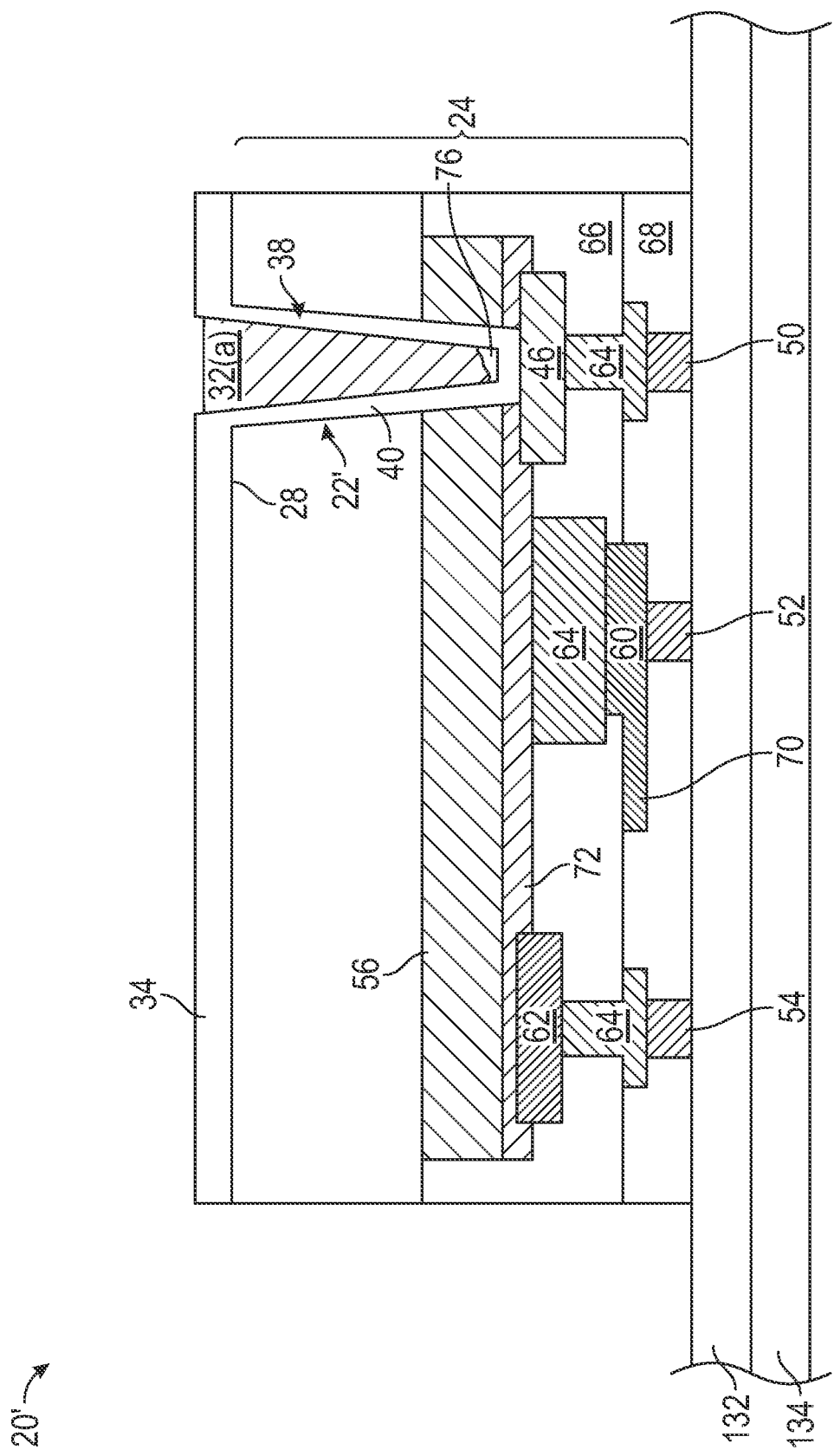

As further indicated in FIG. 2 at STEP 86 of fabrication method 80, sintering may be performed immediately following local deposition step of VF sinter precursor material 32(a)'; although this is not necessary in all embodiments. When performed, such a sintering process may be carried-out by the controlled application of heat, pressure, or combination thereof. For example, in embodiment, a low temperature sintering process may be conducted to transform VF sinter precursor material 32(a)' (FIG. 6) into sintered VF regions 32(a), as indicated in FIG. 7 by heat lines 124. Such a "low temperature" sintering process may be performed during which the peak processing temperatures are maintained below a peak processing temperature $T_{MAX}$. $T_{MAX}$ is preferably less than 300° C. and, perhaps, less than or equal to about 230° C. in embodiments. In many cases, $T_{MAX}$ will be significantly less than the melt point of the metal particles contained within VF sinter precursor material 32(a)' and, perhaps, less than one half the melt point of the particles considered on an absolute temperature scale (in Kelvin). In still further embodiments, $T_{MAX}$ may vary during the sintering process (that is, a multistage heating schedule may be followed), providing that $T_{MAX}$ (in conjunction with the other process parameters) is sufficient to induce sintering of the metal particles without liquefaction thereof. Generally, then, the low temperature sintering process can be carried-out under any process conditions suitable for transforming VF sinter precursor material 32(a)' (FIG. 7) into sintered VF regions 32(a) (FIG. 7). The sintering process may be performed with or without pressure, with or without heating (although some degree of elevated heat will typically be applied), and in any suitable atmosphere (e.g., open air or in the presence of an inert gas, such as nitrogen). The foregoing description is also equally applicable to sintering of DA sinter precursor material 32(b)', which may be subsequently deposited over the respective backsides of the IC dies following singulation of wafer structure 100.

Next, at STEP 88 of the multistage sinter deposition subprocess 128 (FIG. 2), device wafer structure 100 may be singulated or separated into individual units. To this end, device wafer structure 100 may be transferred to a new carrier or platform 134 (e.g., a ring frame) including a relatively thick layer of dicing tape 132. Additionally, if desired, regions of electroplated layer 120 within singulation lanes 108 may be removed prior to wafer singulation; and then singulation may be carried-out by sawing, scribing, laser cutting, or another suitable process. For example, in one approach, a dicing saw (e.g., a water-cooled diamond saw) is directed through singulation lanes 108 (FIG. 7) to remove material from the kerf regions of device wafer structure 100 and thereby separate IC die 24' and the other IC dies into individual units. The resulting structure is in shown in FIG. 8 for IC die 24, which is now depicted in a singulated state with the peripheral sidewalls of IC die 24 defined by singulation. The individual IC dies may then be separately processed to complete method 80 (FIG. 2), with discussion of further processing of IC die 24 presented below connection with FIGS. 9 and 10. The other, non-illustrated IC dies may be processed in a similar manner to IC die 24 to produce the desired die-substrate assemblies; accordingly, the following description is equally applicable to the other newly-separated IC dies produced by singulation of wafer structure 100. In other embodiments, wafer singulation may be performed at another stage, potentially after deposition of DA sinter precursor material 32(b)'.

Figure 9:
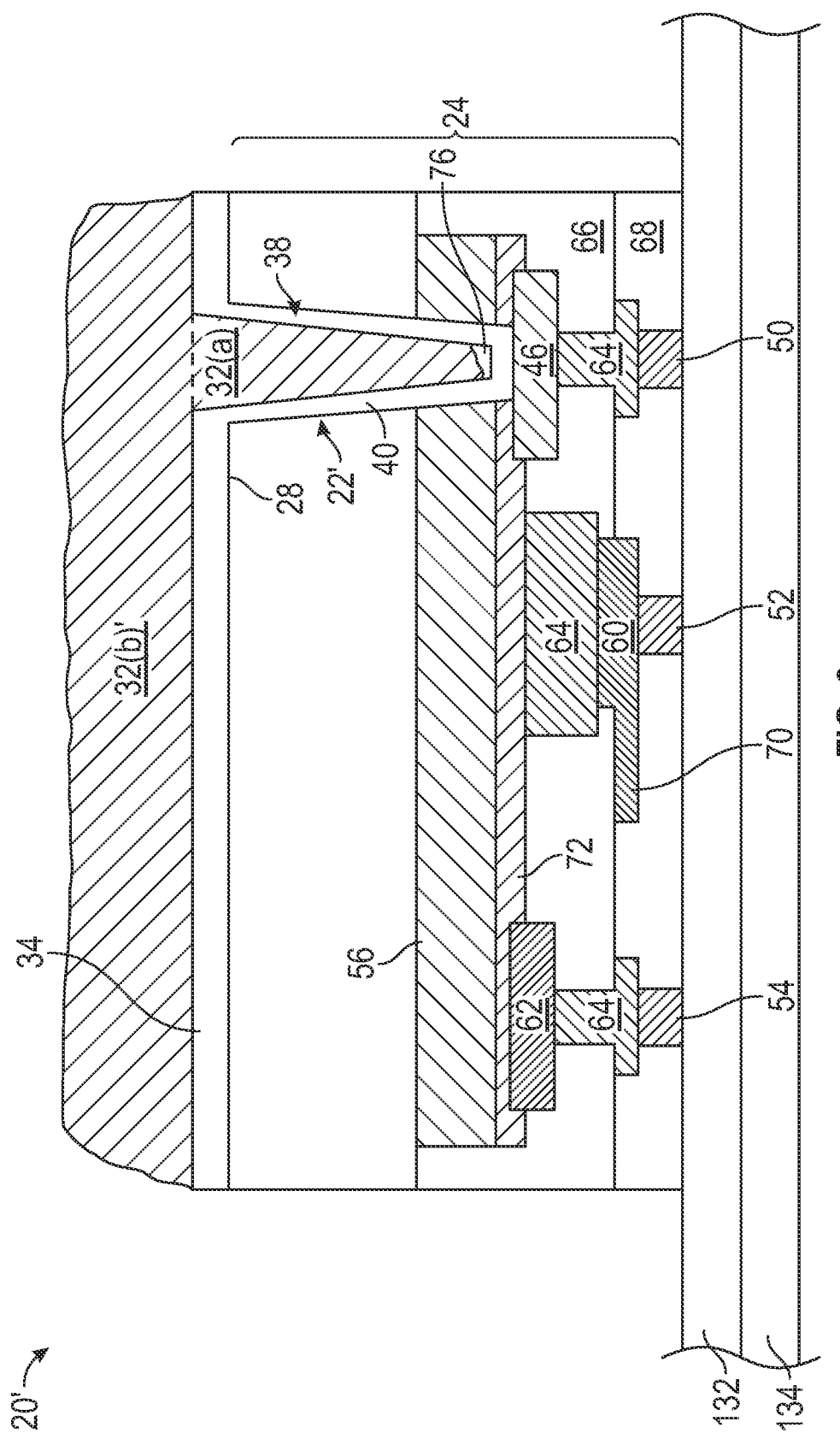

As indicated in FIG. 2 at STEP 90, a second sinter deposition step is next performed to deposit a second body of sinter precursor material, referred to herein as the "DA sinter precursor material 32(b)'," over the backmetal layer 34 of IC die 24. An example of DA sinter precursor material 32(b)', as deposited over backmetal layer 34 of newly-singulated IC die 24, is shown in FIG. 9. The prior statements pertaining to VF sinter precursor material 32(a)', and particularly to possible compositions and deposition techniques for the sinter precursor material, also generally apply to DA sinter precursor material 32(b)'. Accordingly, as described above, DA sinter precursor material 32(b)' may be applied in a dry state (e.g., as a film or powder) or in a wet state (e.g., as a paste), may contain metallic particles in the aforementioned size ranges (e.g., Ag, Au, or Cu nanoparticles), and may further contain other constituents facilitating application of DA sinter precursor material 32(b)'. This stated, DA sinter precursor material 32(b)' is advantageously formulated to vary in composition or certain properties relative to VF sinter precursor material 32(a)' in at least some instances. In this regard, embodiments of, DA sinter precursor material 32(b)' may be formulated to possess a higher viscosity (e.g., due to a lower solvent or liquid content), a greater average metallic particle size, or both a higher viscosity and a greater average metallic particle size than does the VF sinter precursor material 32(a)'. Generally, imparting DA sinter precursor material 32(b)' with such a higher viscosity and/or a greater particle size (in a relative sense) may help facilitate precise control over the bond line thickness of sintered bond layer 32 produced pursuant to sintering, as discussed below in connection with FIG. 10. Comparatively, and as described above in connection with FIGS. 6 and 7, imparting VF sinter precursor material 32(a)' with a lower viscosity and/or a lower particle size may promote relatively complete, low void filling of the backside vias by the VF sinter precursor material. DA sinter precursor material 32(b)' may also be applied under lower temperature conditions than is VF sinter precursor material 32(a)' in at least some instances.

In embodiments of die-substrate assembly fabrication method 80 (FIG. 2), VF sinter precursor material 32(a)' and DA sinter precursor material 32(b)' may further be formulated to differ in metallic particle composition. For example, in at least some implementations, VF sinter precursor material 32(a)' may be formulated to have a lower Ag content, by weight, than does DA sinter precursor material 32(b)' and, perhaps, to be essentially free of Ag; that is, to contain less than 0.1% Ag by weight Such a formulation or composition may enhance electrochemical compatibility of sintered VF portions 32(a) of sintered bond layer 32 within plated backside via 38 in electrically-active regions of IC die 24 (e.g., regions adjacent frontside via contact 46); noting that, due to such a formulation of sinter VF sinter precursor material 32(a)', sintered VF portion 32(a) of sintered bond layer 32 may likewise be substantially free of Ag or otherwise contain a lower Ag content, by weight, than does sintered DA portion 32(b) of sintered bond layer 32. Additionally or alternatively, VF sinter precursor material 32(a)' may have a higher Cu content, by weight, than does DA sinter precursor material 32(b)'; and, correspondingly, sintered VF region 32(a) of sintered bond layer 32 may have a higher Cu content, by weight, than does sintered DA portion 32(b) of sintered bond layer 32. Additionally or alternatively, in various embodiments, DA sinter precursor material 32(b)' may be formulated have a higher Au and/or Ag content than does VF sinter precursor material 32(a)', again measured by weight. As a specific example, in one embodiments, VF sinter precursor material 32(a)' may be formulated such that, pursuant to sintering, sintered VF region 32(a) of sintered bond layer 32 is predominately composed of Cu, by weight; while DA sinter precursor material 32 (b)' is formulated such that sintered DA region 32(b) of sintered bond layer 32 is predominately composed of Ag, by weight. In other embodiments, the respective compositions of precursor materials 32(a)', 32(b)', and the resulting compositions of sintered VF region 32(a) and sintered DA region 32(b) of sintered bond layer 32 may differ in other respects or, instead, may be substantially identical. It is also possible, in embodiments, for VF sinter precursor material 32(a)' to have a greater liquid content for a lower viscosity and higher via fill propensity, but to otherwise have a similar chemical make-up as does DA sinter precursor material 32(b)' such that, pursuant to sintering and organic material burnout, sintered VF region 32(a) and sintered DA region 32(b) have similar, if not substantial identical compositions.

Although not shown in FIG. 9, a ring frame or other fixture may be provided to help confine DA sinter precursor material 32(b)' to a desired volume over backmetal layer 34 of IC die 24. If plated backside via 38 is not yet filled to a level substantially flush with the outer terminal surface of backmetal layer 34, some portion of DA sinter precursor material 32(b)' may also extend into plated backside via 38 to contact sintered VF region 32(a) (if sintering was previously performed) or VF sinter precursor material 32(a)' (if sintering was not previously performed). Notably, DA sinter precursor material 32 (b)' may not or may not be deposited under vacuum in embodiments, as via infiltration by VF sinter precursor material 32(a)' has already largely been accomplished. Further, DA sinter precursor material 32(b)' may deposited utilizing a more globalized (as opposed to localized) deposition technique, such as doctor blading or screen printing with relatively large openings, given that DA sinter precursor material 32(b)' may be spread across the entirety or substantial entirety of backmetal layer 34, by surface area. Dry state application techniques, such as the application of a metal particle-containing film cut to the desired dimension, may also be utilized to apply DA sinter precursor material 32(b)' in embodiments.

Figure 10:
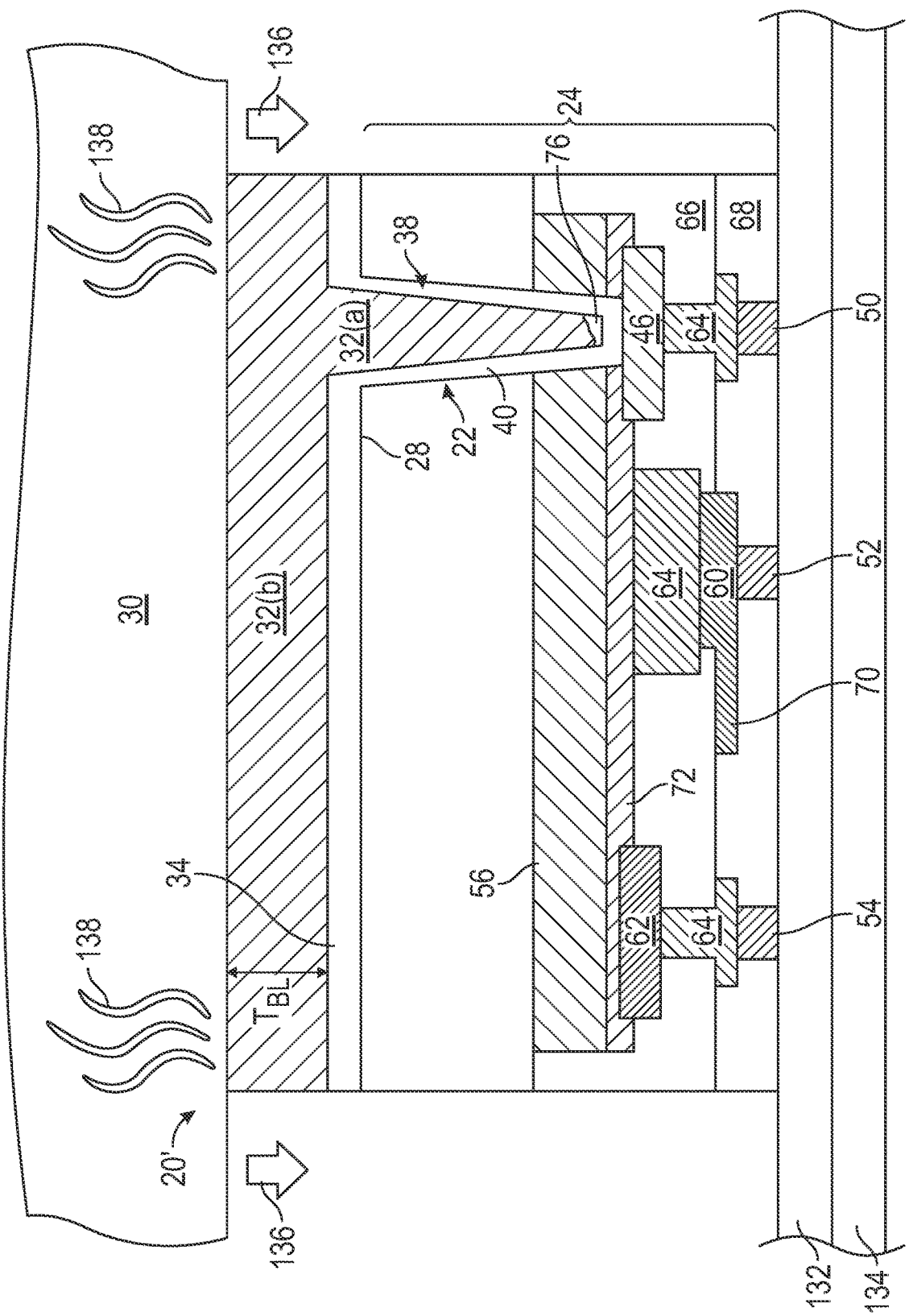

Following application of DA sinter precursor material 32(b)', metallic base flange 30 (or another electrically-conductive substrate) is positioned against the newly-deposited DA sinter precursor material 32(b)', as indicated in FIG. 10 by arrows 136. Base flange 30 may be pressed into DA sinter precursor material 32(b)' and toward IC die 24 to exert a predetermined compressive force across DA sinter precursor material 32(b)' utilizing, for example, a pick-and-place tool or a fixture for concurrently positioning a plurality of non-illustrated base flanges relative to a plurality of non-illustrated IC dies in a manner similar to that shown for IC die 24 in FIG. 10. Additionally, in embodiments in which VF sinter precursor material 32(a)' has not yet been sintered, such a compressive force may help urge further inflow of VF sinter precursor material 32(a)' and, to a lesser extent, DA sinter precursor material 32(b)' into the interior of plated backside via 38; again noting that a non-illustrated ring frame or a similar structure may also be provided to prevent excessive outflow of DA sinter precursor material 32(b)' near the lower edges of IC die 24. The volume of DA sinter precursor material 32(b)' and the positioning of base flange 30 relative to IC die 24 can be carefully controlled to impart the below-described sintered bond layer 32 (and, specifically, sintered DA portion 32(b) of sintered bond layer 32) with a desired bond line thickness; e.g., as noted above, the manufacturing process may be carried-out such that the bond line thickness of sintered bond layer 32 ranges from about 7 to about 100 μm and, perhaps, from about 15 to about 25 μm in embodiments. In other implementations, the bond line thickness of sintered bond layer 32 may vary; and/or DA sinter precursor material 32(b)' may initially be applied to base flange 30, which is then positioned relative to IC die 24 to bring backmetal layer 34 into contact with DA sinter precursor material 32(b)'.

Following this, at STEP 92 of subprocess 128 (FIG. 2), sintering is subsequently carried-out. Such sintering process can be carried-out by the controlled application of heat, pressure, or combination thereof. For example, in embodiment, a low temperature sintering process may be conducted to transform DA sinter precursor material 32(b) (FIG. 9) into DA sintered body 32(b), thereby yielding sintered bond layer 32 and, more generally, sinter-bonded backside via structure 22. Such a low temperature sintering process is represented in FIG. 10 by heat lines 138, and the foregoing description regarding sintering temperatures and techniques is equally applicable to this step in the manufacturing process. Additionally, in at least some implementations, a controlled convergent pressure may be applied across IC die 24 and electrically-conductive base flange 30 during the sintering process. If not previously sintered, VF sinter precursor material 32(a)' is concurrently transformed into sintered VF region 32 (a) during this sintering step. Depending upon the desired final composition of sintered bond layer 32, the parameters of the sintering process may be controlled to decompose organic materials from sinter precursor material 32(a), in whole or in part Lastly, the partially-completed die-substrate assembly 20' may be removed from carrier 134 and subject to any further processing or testing to yield the completed die-substrate assembly 20 shown in FIG. 1. Following this, any desired steps may be performed, and the completed die-substrate assembly 20 (FIG. 1) may be mounted onto a selected substrate and ultimately integrated into larger devices (e.g., systems, packages, or assemblies) when so desired.

By virtue of the above-described processes, die-substrate assembly 20 is imparted with a unique, sinter-bonded backside via structure 22, which contain a plated backside via 38 and a sintered bond layer 32. Sintered bond layer 32, including sintered VF region 32(a) and sintered DA region 32 (b) of sintered bond layer 32, may consist essentially of one or more metals (e.g., essentially pure Cu or essentially pure Ag) and are essentially free of organic material; that is, contain less than 1% weight of organic materials. In other embodiments, sintered bond layer 32 may contain resin or other organic fillers, depending upon the formulation of the above-described sinter precursor materials. For example, in another implementation, sintered DA region 32(b) may contain organic materials that increase pliability, such as an epoxy, to reduce the likelihood of crack formation and propagation across thermal cycles; while sintered VF region 32(a) may contain a lesser amount, or may be free of, such organic materials. A low electrical and thermal resistance connection is formed between plated backside via 38 and metallic base flange 30, which may serve as a terminal of the die-substrate assembly 20 and, more generally, of a microelectronic package into which the die-substrate assembly is ultimately integrated. Lower contact resistance decreases the $R_{SD\_ON}$ values of transistor-bearing dies (e.g., dies bearing peaking or carrier transistors ICs) when operational for increased performance; the term "$R_{SD\_ON}$ value" referring to the cumulative resistance between the source and the drain of a transistor, such as a FET, when switched on.

In further embodiments of fabrication method 80, the sinter precursor material utilized to form sintered bond layer 32 may be deposited as a single mass or layer. For example, as indicated in FIG. 2 at stage 126, a subprocess can be carried-out during which device wafer structure 100 is initially singulated (STEP 94); the sinter precursor material is then deposited as a single mass or layer (STEP 96); and then the above-described steps of positioning base flange 30 and carrying-out a sintering process are conducted (STEP 98). In this case, and referring again briefly to FIG. 9, a single body or volume of sinter precursor material may be deposited over backmetal layer 34 of IC die 24 to concurrently form VF sinter precursor material region 32(a)' and DA sinter precursor material region 32(b)'. Such a deposition step is advantageously performed under vacuum (e.g., in a vacuum chamber) to promote the inflow of the sinter precursor material into the interior of backside via 38, as previously described. Any suitable deposition technique may be utilized, such as doctor blading, screen printing, and other wet state application techniques; again noting that plasma cleaning or another technique may be performed to prior to sinter precursor material deposition to enhance the wettability of inner via lining 40.

Following single stage deposition of the sinter precursor material, metallic base flange 30 may then be placed in its desired position adjacent IC die 24. During positioning, base flange 30 may be pressed into the sinter precursor material in a direction toward IC die 24 to urge increased penetration of the sinter precursor material into backside via 38, with this placement step potentially performed under elevated temperature conditions. Afterwards, a sintering process may be carried-out to transform the sinter precursor material into sintered bond layer 32 including sinter VF region 32(a) and sintered DA region 32(b). Such a single stage deposition process may thus reduce the number of process steps to accelerate the manufacturing process, but with the tradeoff of reducing the ability to impart the sinter precursor material with different formulations in regions 32(a) and 32(b). In still other instances, such a single stage deposition technique may be conducted prior to wafer singulation, potentially utilizing a stencil or screen printing technique to avoid deposition of the sinter precursor material into the singulation lanes or saw streets. Attachment of IC die 24 to base flange 30 may then be performed prior to wafer singulation in instances in which base flange 30 (or another substrate, such as a coin) has planform dimensions less than those of IC die 24; or, more likely, die attach may be conducted following wafer singulation in a manner tantamount to that described above in connection with FIG. 10.

CONCLUSION

There has thus been provided die-substrate assemblies, and methods for fabricating die-substrate assemblies, containing sinter-bonded backside via structures. Within the sinter-bonded backside via structure, a sintered bond layer fills at least a portion, if not the substantial entirety of one or more plated backside vias. The sintered bond layer similarly contacts and forms metallurgical bonds with a backmetal layer, which extends over the backside of an IC die. The resulting die attachment interface provides a high strength metallurgical bonds between the backmetal layer, the backside via lining, the sintered bond layer, and the package substrate to reduce the likelihood of separation along these interfaces during subsequent thermal cycling of the die-substrate assembly. Additionally, a low electrical and thermal resistance connection is formed between the plated backside via and the metallic base flange (or another substrate), which may serve as a terminal of the die-substrate assembly and, more generally, of a microelectronic package into which the die-substrate assembly is ultimately integrated. Lower $R_{SD\_ON}$ values and enhancing the thermal performance of transistor-bearing dies (e.g., dies bearing peaking or carrier transistors ICs) when operational.

In embodiments, the method for fabricating a die-substrate assembly includes the step or process of obtaining an integrated circuit (IC) die having a backside over which a backmetal layer is formed and into which a plated backside via extends. The plated backside via includes a backside via lining or plating electrically coupled to the backmetal layer. A sinter-bonded backside via structure is further produced to attach the IC die to an electrically-conductive substrate. The sinter-bonded backside via structure is produced by: (i) applying sinter precursor material over the backmetal layer and into the plated backside via; (ii) after or in conjunction with application of the sinter precursor material, positioning the IC die adjacent a die support surface of the electrically-conductive substrate; and (iii) sintering the sinter precursor material to yield a sintered bond layer metallurgically bonded to the backside via lining, the backmetal layer, and the die support surface of the electrically-conductive substrate. In at least some embodiments, the sintered bond layer may be produced to fill at least a majority, if not a substantial entirety of the plated backside via, by volume. Additionally or alternatively, the sintered bond layer to extend over a substantial entirety of the backmetal layer by surface area.

In further embodiments, a die-substrate assembly includes an IC die having a backside, a backmetal layer formed over the backside of the IC die, an electrically-conductive substrate having a die support surface, and a sinter-bonded backside via structure. The sinter-bonded backside via structure includes, in turn, a plated backside via and a sintered bond layer. The plated backside via extends into the IC die from the backside thereof and has backside via lining electrically coupled to the backmetal layer. The sintered bond layer contacts and is metallurgically bonded to the backside via lining, to the backmetal layer, and to the die support surface of the electrically-conductive substrate such that circuitry integrated into the IC die is electrically coupled to the electrically-conductive substrate through the plated backside via and the sintered bond layer. In certain implementations, the sintered bond layer fills at least a majority of the plated backside via, by volume. In other embodiments in which the IC die comprises a gallium nitride portion and silicon carbide portion, the sintered bond layer to extends from a mouth region of the plated backside via, through the silicon carbide portion, and into the gallium nitride portion of the IC die.

While at least one example embodiment has been presented in the foregoing Detailed Description, it should be appreciated that a vast number of variations exist. It should also be appreciated that the example embodiment or example embodiments are only examples, and are not intended to limit the scope, applicability, or configuration of the invention in any way. Rather, the foregoing Detailed Description will provide those skilled in the art with a convenient road map for implementing an example embodiment of the invention. It being understood that various changes may be made in the function and arrangement of elements described in an example embodiment without departing from the scope of the invention as set forth in the appended claims.

What is claimed is:

1. A method for fabricating a die-substrate assembly, comprising:
   obtaining an integrated circuit (IC) die having a backside over which a backmetal layer is formed and into which a plated backside via extends, the plated backside via having a backside via lining electrically coupled to the backmetal layer; and
   producing a backside structure attaching the IC die to an electrically-conductive substrate, producing comprising:
      applying sinter precursor material over the backmetal layer and into the plated backside via;
      after or in conjunction with application of the sinter precursor material, positioning the IC die adjacent a die support surface of the electrically-conductive substrate; and
      sintering the sinter precursor material to yield a sintered bond layer metallurgically bonded to the backside via lining, the backmetal layer, and the die support surface of the electrically-conductive substrate.

2. The method of claim 1, further comprising forming the sintered bond layer to fill at least a majority of the plated backside via, by volume.

3. The method of claim 2, wherein forming comprises forming the sintered bond layer to extend over a substantial entirety of the backmetal layer by surface area.

4. The method of claim 2, wherein forming comprises forming the sintered bond layer to fill a substantial entirety of the plated backside via, by volume.

5. The method of claim 1, further comprising forming the sinter-bonded backside via structure to electrically couple circuitry integrated into the IC die to the electrically-conductive substrate through the plated backside via and the sintered bond layer.

6. The method of claim 1, wherein the IC die comprises a gallium nitride portion and silicon carbide portion; and
   wherein the method comprises forming the sintered bond layer to extend from a mouth region of the plated backside via, through the silicon carbide portion, and into the gallium nitride portion of the IC die.

7. The method of claim 1, wherein the IC die comprises a power radio frequency (RF) die containing a field effect transistor (FET); and wherein the method comprises electrically coupling a source terminal of the FET to the electrically-conductive substrate through the plated backside via and through the sintered bond layer.

8. The method of claim 1, wherein applying comprises depositing the sinter precursor material into the plated backside via under vacuum to promote inflow of the sinter precursor material into the plated backside via.

9. The method of claim 1, wherein applying comprises depositing a first body of sinter precursor material into the backside via, while the IC die remains interconnected with a plurality of other IC dies contained in a device wafer structure.

10. The method of claim 9, wherein depositing comprises depositing the first body of sinter precursor material under vacuum conditions promoting inflow of the first body of sinter precursor material into the plated backside via and into a plurality of other plated backside vias formed in the plurality of other IC dies contained in the device wafer structure.

11. The method of claim 9, wherein applying further comprises further depositing a second body of sinter precursor material over the backmetal layer and the plated backside via after singulation of the device wafer structure.

12. The method of claim 11, further comprising formulating the first body of sinter precursor material to have a lower viscosity than does the second body of sinter precursor material.

13. The method of claim 11, further comprising formulating the first body of sinter precursor material to contain smaller average particle diameter than does the second body of sinter precursor material.

14. The method of claim 11, further comprising formulating the first body of sinter precursor material to contain a lesser percentage of silver than does the second body of sinter precursor material, by weight.

15. The method of claim 11, wherein sintering comprises concurrently sintering the first body of sinter precursor material and the second body of sinter precursor material after singulation of the device wafer structure.

16. The method of claim 1, wherein applying comprises depositing the sinter precursor material over the backmetal layer and into the backside via of the IC die following separation of the IC die from a plurality of other IC dies contained in a device wafer structure.

17. The method of claim 1, further comprising depositing the sinter precursor material in a predetermined volume and positioning the IC die adjacent the die support surface such that, pursuant to sintering, the sintered bond layer has a bond line thickness between about 7 and about 100 microns.

18. A die-substrate assembly, comprising:
 an integrated circuit (IC) die having a backside;
 a backmetal layer formed over the backside of the IC die;
 an electrically-conductive substrate having a die support surface; and
 a backside structure, comprising:
  a plated backside via extending into the IC die from the backside thereof and having backside via lining electrically coupled to the backmetal layer; and
  a sintered bond layer contacting and metallurgically bonded to the backside via lining, the backmetal layer, and the die support surface of the electrically-conductive substrate such that circuitry integrated into the IC die is electrically coupled to the electrically-conductive substrate through the plated backside via and the sintered bond layer.

19. The die-substrate assembly of claim 18, wherein the sintered bond layer fills at least a majority of the plated backside via, by volume.

20. The die-substrate assembly of claim 18, wherein the IC die comprises a gallium nitride portion and silicon carbide portion; and
 wherein the sintered bond layer extends from a mouth region of the plated backside via, through the silicon carbide portion, and into the gallium nitride portion of the IC die.

* * * * *